(12) United States Patent
Takakura et al.

(10) Patent No.: US 7,102,551 B2
(45) Date of Patent: Sep. 5, 2006

(54) VARIABLE LENGTH DECODING DEVICE

(75) Inventors: Kentaro Takakura, Takatsuki (JP); Shinji Kitamura, Nagaokakyo (JP); Taichi Nagata, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/214,343

(22) Filed: Aug. 30, 2005

(65) Prior Publication Data

US 2006/0044165 A1 Mar. 2, 2006

(30) Foreign Application Priority Data

Aug. 31, 2004 (JP) ............................. 2004-252607

(51) Int. Cl.
*H03M 7/40* (2006.01)
(52) U.S. Cl. ........................ 341/67; 341/63; 341/65; 382/245; 382/246; 382/250
(58) Field of Classification Search ................ 341/63, 341/67
See application file for complete search history.

(56) References Cited

U.S. PATENT DOCUMENTS 5,369,405 A * 11/1994 Choi et al. ................... 341/63
5,689,254 A * 11/1997 Fujiwara et al. .............. 341/59
6,967,600 B1 * 11/2005 Kadono et al. ............... 341/67
6,987,811 B1 * 1/2006 Tanaka et al. ........... 375/240.25

FOREIGN PATENT DOCUMENTS

JP          8-167856 A          6/1996

* cited by examiner

*Primary Examiner*—Rexford Barnie
*Assistant Examiner*—Khai M. Nguyen
(74) *Attorney, Agent, or Firm*—McDermott Will & Emery LLP

(57) ABSTRACT

A variable length decoding device for decoding variable length coding data and run length coding data according to the present invention comprises a variable length decoding unit 3 for serially decoding the variable length coding data and the run length coding data inputted from outside in a state in which "RUN" representing number of "0" and "LEVEL" representing a magnitude of a coefficient value are combined, a data buffer 4 for storing the "LEVEL", address retainers 5 and 6 for retaining an address of the "LEVEL" corresponding to the "RUN" based on the number of "0" indicated by the "RUN", a write control unit 7 for writing the "LEVEL" in the data buffer 4 based on the information of the address retainers, and a read control unit 8 for reading the "LEVEL" from the data buffer 4 based on the information of the address retainers.

27 Claims, 37 Drawing Sheets

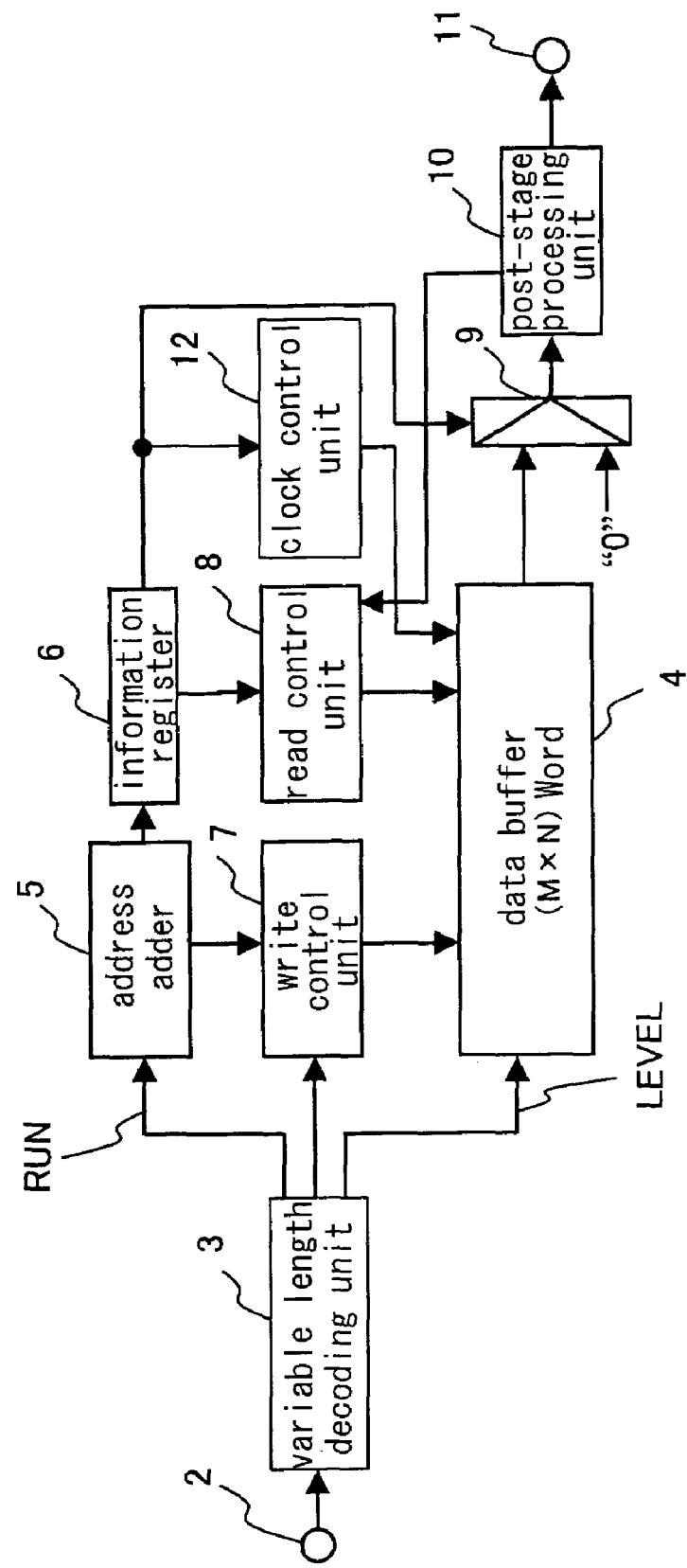
F I G. 5

| A0 | A1 | A2 | A3 | A4 | A5 | A6 | A7 |
|---|---|---|---|---|---|---|---|
| 1,2 | 9,17 | 10,3 | 4,11 | 18,25 | 33,26 | 19,12 | 5,6 |
| A8 | A9 | A10 | A11 | A12 | A13 | A14 | A15 |
| 13,20 | 27,34 | 41,49 | 42,35 | 28,21 | 14,7 | 8,15 | 22,29 |
| A16 | A17 | A18 | A19 | A20 | A21 | A22 | A23 |
| 36,43 | 50,57 | 58,51 | 44,37 | 30,23 | 16,24 | 31,38 | 45,52 |
| A24 | A25 | A26 | A27 | A28 | A29 | A30 | A31 |
| 59,60 | 53,46 | 39,32 | 40,47 | 54,61 | 62,55 | 48,56 | 63,64 |

F I G. 1 6
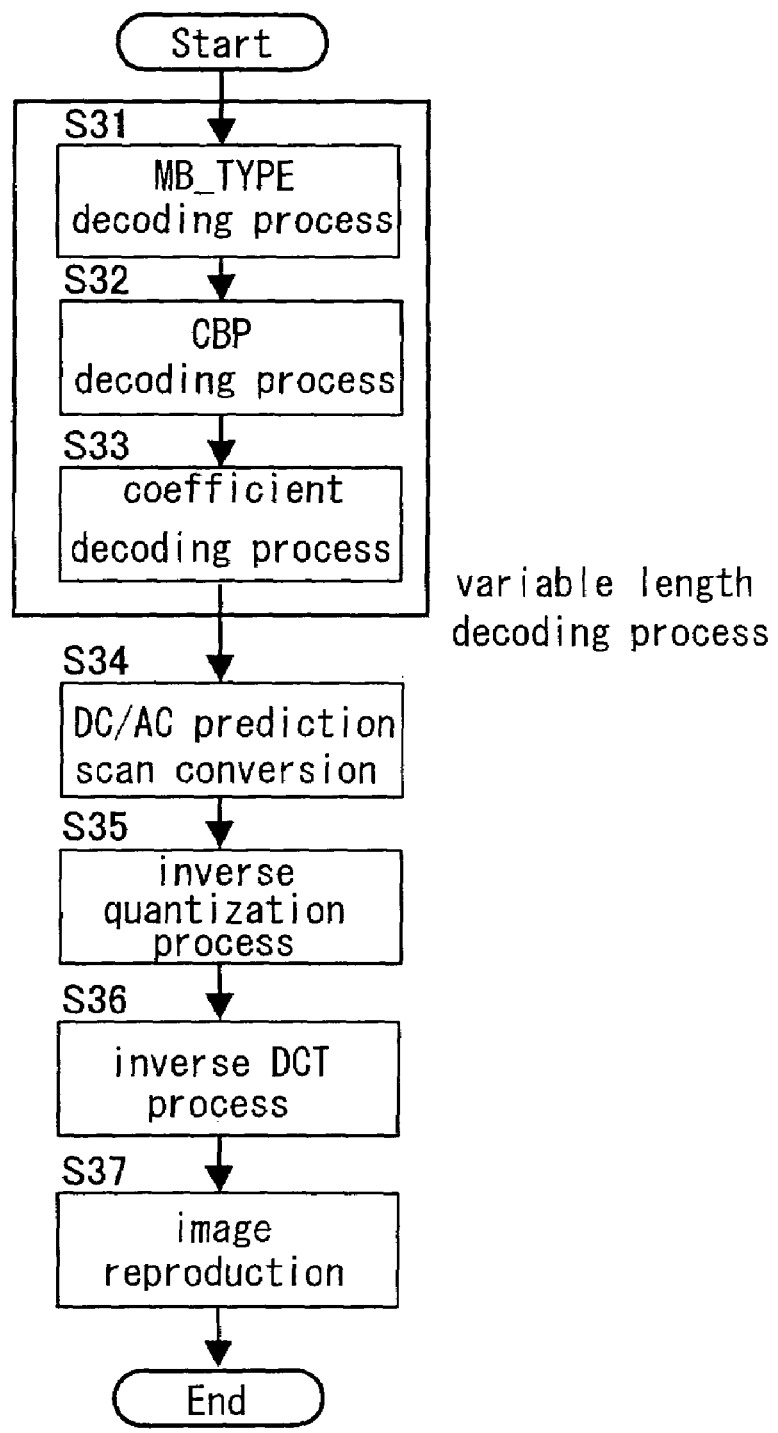

F I G. 1 8

F I G. 1 9

F I G. 3 3

| 1 | 2 | 17 | 11 | 26 | 20 | 41 | 1 |
|---|---|----|----|----|----|----|---|
| 10 | 25 | 19 | 27 | | | | |
| | | | | | | | |
| | | | | | | | |
| | | | | | | | |
| | | | | | | | |
| | | | | | | | |
| | | | | | | | |

VARIABLE LENGTH DECODING DEVICE

FIELD OF THE INVENTION

The present invention relates to a decoding method and a decoding device for executing a variable length decoding and a run length decoding to code data in which a run length coding and a variable length coding are used, more particularly to a variable length decoding method and a variable length decoding device used in an image extension technology for extending compressed image data. The present invention further relates to an image pickup system.

BACKGROUND OF THE INVENTION

A method of compressing/extending compressed data using a run length coding and a variable length coding is used in JPEG (Joint Photographic Experts Group) and MPEG (Moving Picture Experts Group), which are general technologies for compressing image data. Along with the spread of a digital camera and a digital video camera and the advancement of the communication technology, the method has been made widely available as a technology capable of transferring data with a small volume of information.

A typical example of an image compression device is shown in FIG. 36. Below is given a description of the device referring to FIG. 36

Image data divided into blocks each comprising 8×8 pixels beforehand and serially inputted is frequency-converted in a DCT (Discrete Cosine Transform) unit 101 for executing a discrete cosine conversion so as to generate a DCT coefficient. Inmost of natural images, colors smoothly changes. As a result of executing the frequency-conversion, the DCT coefficients having larger values gather in a low-frequency region m, while the DCT coefficients having smaller values are distributed in a high-frequency region n as shown in FIG. 37. A coefficient in an upper-left corner, in particular, is referred to as a DC component having no frequency component, and any other coefficient is referred to as an AC component.

In a quantization unit 102, the DCT coefficient is divided by a preset quantization value so as to generate a quantization coefficient. As a result of the processing, the coefficients of "0" can be aggregated in the high-frequency region which does not affect an image quality.

In a variable length coding unit 103, "RUN" representing the number of "0" and "LEVEL" representing the magnitude of the coefficient value are combined in the order of a zigzag scan as shown in FIG. 38 so as to generate run length data. In compliance with the appearance ratio of the foregoing combinations, code words having different lengths are allocated so as to reduce a data capacity.

An image extension device for decoding the variable length code data coded in the foregoing manner comprises a variable length decoding unit 104, an inverse quantization unit 105 and an inverse DCT unit 106, which correspond to the constitution of the image compression device, as shown in FIG. 39.

In the variable length decoding unit 104, the data is decoded in the state in which the "RUN" representing the number of "0" and the "LEVEL" representing the magnitude of the coefficient value are combined, and the "0" coefficients as many as the magnitude of the "RUN" are generated and combined with the coefficients represented by the "LEVEL". This operation is repeated until the coefficients corresponding to 8×8 pixels are generated.

The generated coefficients corresponding to 8×8 pixels are multiplied by a preset quantization value in the inverse quantization unit 105 so as to obtain an inverse-quantization DCT coefficient. Further, the coefficients are subjected to a frequency region—spatial region conversion in the inverse DCT unit 106, and the image data is thereby decoded.

A conventional constitution of the variable length decoding unit 104 is described referring to FIG. 40.

The variable length code data inputted from an input unit 107 is decoded in a variable length decoding unit 108 in the state in which the "RUN" representing the number of "0" and the "LEVEL" representing the magnitude of the coefficient value are combined. A write control unit 109 supplies a selection signal to a selector 110 so that "0" as many as the number of the decoded "RUN" are written in a data buffer 112. After "0" corresponding to the number of the decoded "RUN" are written, the coefficients represented by the "LEVEL" are written in the data buffer 112. This operation is repeated until the coefficients as many as the 8×8 pixels are generated, and then, the data is serially read from the data buffer 112 by a read control unit 111 in the order of the zigzag scan (FIG. 38) and outputted from an output unit 113 to the inverse quantization unit 105.

However, in the conventional constitution, during a period when the "0" coefficients as many as the number of the decoded "RUN" are consecutively written, the processing of the variable length decoding unit 108 cannot be executed. The disadvantage resulted in the generation of an idle period, which was unfavorably an impediment in achieving a higher-speed operation.

As a solution of the aforementioned problem was proposed a run length code decoding circuit disclosed in No. 08-167856 of the Publication of the Unexamined Japanese Patent Applications (p. 4–7, FIG. 7). Below is described an example of the run length code decoding circuit referring to FIG. 41.

All of data words stored in a first data buffer 116 and a second data buffer 117 are initialized to "0" beforehand. The variable length code data inputted from an input unit 114 is decoded in a variable length decoding unit 115 in the state in which the "RUN" representing the number of "0" and the "LEVEL" representing the magnitude of the coefficient value are combined. The "LEVEL" data is supplied to selecting units 122 and 123, while the decoded "RUN" data is supplied to an address adder 118 so that only values of the "RUN" are linearly added, and then, a result of the addition is outputted to a write control unit 119. The outputted data is converted into zigzag scan addresses in the write control unit 119, and a result of the conversion is outputted to selecting units 124 and 125. The address adder 118 serves to supply an "H" level to the selecting units 122 and 124 or the selecting units 123 and 125 as a selection signal, while supplying the other with an "L" level, and invert a logic "LEVEL" of the selection signal before the processing corresponding to 8×8 pixels is completed.

A read control unit 120 outputs an read address to the data buffer 117 when the address adder 118 supplies the selecting units 122 and 124 with the "H" level, while outputting the read address to the data buffer 116 when the address adder 118 supplies the selecting units 123 and 125 with the "H" level. Output data is outputted from one of the data buffers 116 and 117 via an output unit 126 or 127 in accordance with the read address from the read control unit 120.

When the read address is outputted from the read control unit 120 to the data buffer 116 or 117, an initializing unit 121 outputs the same address by a slightly shifted timing as an initialization address to the selecting unit 124 or 125.

The selecting units 122 and 123 output the "LEVEL" data from the variable length decoding unit 115 to the relevant data buffers 116 and 117 when the selection signal from the address adder 118 is the "H" level, while outputting "0" thereto when the selection signal is the "L" level.

The selecting units 124 and 125 output the zigzag scan addresses from the write control unit 119 when the selection signal form the address adder 118 is the "H" level, while outputting the initialization address from the initializing unit 121 when the selection signal is the "L" level.

The addresses from the address adder 118 and the read control unit 120 are initialized to an initial value every time when the processing corresponding to 8×8 pixels is completed.

According to the decoding circuit shown in FIG. 41, only the "LEVEL" data overwrites "0" at the position identified in the zigzag scan addresses is based on the decoded run length code after all of the data stored in the first data buffer 116 is initialized to "0". Thus, one block stored in the second data buffer 117 is read and initialized during the period when only the non-"0" components of the 8×8 pixels constituting one block are written in the first data buffer 116.

According to the conventional technology, when the data stored in the data buffer is initialized to "0" in advance, and only the "LEVEL" data is written at the corresponding position in the data buffer based on the run length code, the processing required for one block can be reduced in accordance with the number of the non-"0" components of the 8×8 pixels constituting one block.

However, it becomes necessary to initialize the data buffer in the foregoing conventional constitution. Further, the idle time generated between the decoding process and the read operation and the number of accesses with respect to the data buffer could not be disadvantageously reduced because all of the data was necessarily read from the data buffer.

SUMMARY OF THE INVENTION

Therefore, a main object of the present invention is to provide a variable length decoding method and a variable length decoding device capable of dispensing with the initialization of a data buffer and achieving a high efficiency by shortening a processing time in a read operation.

In order to achieve the foregoing object, a variable length decoding device according to the present invention is a variable length decoding device for decoding variable length coding data and run length coding data, comprising:

a variable length decoding unit for serially decoding variable length coding data and run length coding data inputted from outside in a state in which "RUN" representing number of "0" and "LEVEL" representing a magnitude of a coefficient value are combined;

a data buffer for storing the "LEVEL";

an address retainer for retaining an address of the "LEVEL" corresponding to the "RUN" based on the number of "0" indicated by the "RUN";

a write control unit for writing the "LEVEL" in the data buffer based on the information of the address retainer;

a read control unit for reading the "LEVEL" from the data buffer based on the information of the address retainer;

a selecting unit for selecting one of the "LEVEL" stored in the data buffer and "0" based on the information of the address retainer and outputting the selected data; and a post-stage processing unit for executing a post-stage processing to the data from the selecting unit and outputting the resulting data outside.

The foregoing constitution is technically characterized in that the data read from the data buffer is limited to the "LEVEL" by the combination of the address retainer and the selecting unit.

According to the foregoing constitution, only the "LEVEL" is read based on the information of the address retainer in the minimum constitution so that the number of accesses with respect to the data buffer can be reduced. As a result, the variable length decoding device consuming less power can be provided.

In the variable length decoding device constituted as described, the address retainer preferably comprises:

an address adder for calculating the address of the "LEVEL" corresponding to the "RUN" based on the number of "0" indicated by the "RUN" and controlling the write control unit; and an information register for memorizing the result obtained by the address adder and controlling the selecting unit and the read control unit.

According to the foregoing constitution, only the "LEVEL" is read based on the information stored in the information register in the minimum constitution so that the number of accesses with respect to the data buffer can be reduced. As a result, the variable length decoding device consuming less power can be provided.

In the foregoing constitution, the information is preferably stored in the information register in the order of decoding based on the inputted "RUN".

The variable length decoding device according to the present invention preferably further comprises:

a clock control unit for controlling a clock to be supplied to the data buffer, wherein the clock control unit supplies the clock to the data buffer during only a period when the data value is not "0" based on the value stored in the information register (information on whether or not the data value in the data buffer is "0").

According to the foregoing constitution, the clock is supplied to the data buffer in the limited length of time. As a result, the variable length decoding device consuming less power can be provided.

In the variable length decoding device constituted as described, an address memorizing unit for memorizing the address of the "LEVEL" corresponding to the "RUN" based on the number of "0" indicated by the "RUN" and controlling the write control unit, read control unit and selecting unit preferably constitutes the address retainer.

According to the foregoing constitution, only the "LEVEL" is read based on the address memorizing unit in the minimum constitution so that the number of accesses with respect to the data buffer can be reduced. As a result, the variable length decoding device consuming less power can be provided.

As a preferable constitution of the variable length decoding device according to the present invention, the data buffer is adapted to store L (L is a natural number at least two) number of "LEVEL" at one address, a second selecting unit for selecting and outputting the L number of data based on the value of the information register is further provided, and the L number of data is simultaneously read based on the value of the information register.

According to the foregoing constitution, the information register can be simultaneously judged in a plurality of bits so that the number of accesses with respect to the data buffer can be reduced. As a result, the variable length decoding device consuming less power can be provided.

A variable length decoding device according to the present invention comprises:

a variable length decoding unit for serially decoding variable length coding data and run length coding data inputted from outside in a state in which "RUN" representing number of "0" and "LEVEL" representing a magnitude of a coefficient value are combined;

a first data buffer for storing the "LEVEL";

an address retainer for retaining an address the "LEVEL" corresponding to the "RUN" based on the number of "0" indicated by the "RUN" (combination of the address adder and the information register or the address memorizing unit as described earlier);

a first write control unit for writing the "LEVEL" in the first data buffer based on the information of the address retainer;

a first read control unit for reading the "LEVEL" from the first data buffer based on the value of the address retainer;

a selecting unit for selecting one of the "LEVEL" stored in the first data buffer and "0" based on the value of the address retainer and outputting the selected data;

a second data buffer for storing the data from the selecting unit;

a second write control unit for controlling the write operation with respect to the second data buffer in conjunction with the operation of the first read control unit;

a second read control unit for controlling the read operation with respect to the second data buffer; and a post-stage processing unit for executing a post-stage processing to the data from the second data buffer and outputting the resulting data outside.

According to the foregoing constitution, the data of the first data buffer can be outputted without waiting for the processing of the post-stage processing unit to be completed, which allows the next variable length decoding to be soon executed. As a result, the decoding process can be accelerated.

The variable length decoding device according to the present invention is preferably adapted to output the data from the selecting unit not only to the second data buffer but also to the post-stage processing unit.

According to the foregoing constitution, the write operation with respect to the second buffer can be avoided when the processing of the post-stage processing unit is executed earlier than expected. As a result, the decoding process can be generally accelerated.

The variable length decoding device according to the present invention comprising the address adder is preferably further provided with:

a group of information registers including at least an information register for storing the data in different arranging orders based on the result obtained by the address adder; and a register selecting unit for obtaining characteristic information indicating a characteristic of decoding data from the post-stage processing unit and selecting any of the group of information registers based on the characteristic information.

According to the foregoing constitution, the decoding process can be executed at a higher rate in the variable length decoding process having a plurality of scanning modes such as MPEG-4.

A variable length decoding device according to the resent invention is a variable length decoding device for decoding variable length coding data and run length coding data, comprising:

a variable length decoding unit for serially decoding variable length coding data and run length coding data inputted from outside in a state in which "RUN" representing number of "0" and "LEVEL" representing a magnitude of a coefficient value are combined;

a first data buffer for storing the "LEVEL";

an address adder for calculating an address the "LEVEL" corresponding to the "RUN" based on the number of "0" indicated by the "RUN";

a first information register for memorizing the result obtained by the address adder;

a first write control unit for storing the "LEVEL" in the first data buffer based on the information of the address retainer;

a first read control unit for reading the "LEVEL" from the first data buffer based on the value of the first information register;

a second information register having a constitution identical to that of the first information register;

a second data buffer for storing the "LEVEL" from the first data buffer;

a second write control unit for controlling the write operation with respect to the second data buffer in conjunction with the operation of the first read control unit;

a second read control unit for controlling the read operation with respect to the second data buffer based on a value of the second information register;

a selecting unit for selecting one of the "LEVEL" stored in the second data buffer and "0" based on the value of the second information register; and a post-stage processing unit for executing a post-stage processing to the data outputted from the selecting unit and outputting the resulting data outside.

According to the foregoing constitution, only the "LEVEL" is transferred between the first and second data buffers, which realizes the variable length decoding at a higher speed.

The variable length decoding device according to the present invention is preferably further provided with an initializing unit for initializing the second data buffer, wherein the second data buffer is initialized by the initializing unit after the read operation is completed.

According to the foregoing constitution, the selecting unit for selecting one of the "LEVEL" and "0" from the first data buffer can be omitted, and only the "LEVEL" is transferred between the first and second data buffers. As a result, the variable length decoding can attain a higher speed with the minimum constitution.

The variable length decoding device according to the present invention comprising the second data buffer, the second write control unit and the second read control unit is further provided with:

a group of data buffers in which at least one data buffer including the second data buffer is arranged; and a second selecting unit for selecting the data read from the plurality of data buffers, wherein the data from the first data buffer is stored sequentially in each of the plurality of data buffers.

According to the foregoing constitution, the data of the first data buffer can be outputted without waiting for the processing of the post-stage processing unit to be completed, which allows the next variable length decoding to be soon executed. As a result, the decoding process can be accelerated.

The variable length decoding device according to the present invention comprises a plurality of processing systems in which the information register, the data buffer, the write control unit and the read control unit constitute a system, and further comprises a switching unit for controlling in a switching manner which data buffer belonging to one of the processing systems outputs the data to the post-stage processing unit, wherein the write operation with respect to the data buffer in one of the processing systems and the read operation with respect to the data buffer in another of the processing systems are simultaneously executed.

When the write operation and the read operation are simultaneously executed in the foregoing constitution, the data can be transferred without waiting for the read operation with respect to the data buffer to be completed. Thereby, a time length required for the processing of the variable length decoding can be reduced, as a result of which the decoding process can be generally executed at a higher speed.

In the variable length decoding device according to the present invention, a memory comprising a write port and a read port capable of independently reading the data constitutes the data buffer, and the information register has a bit length corresponding to at least one block, wherein the write and read operations are executed in parallel in such manner that the read operation by the read control unit is commenced when the "LEVEL" is written in the data buffer.

When the write operation and the data operation are simultaneously executed in the foregoing constitution, the data can be transferred without waiting for the read operation with respect to the data buffer to be completed. Thereby, the processing time of the variable length decoding can be reduced, as a result of which the decoding process can be generally executed at a higher speed in the minimum constitution.

Next, a variable length decoding method according to the present invention is a variable length decoding method for decoding variable length coding data and run length coding data, comprising:

a step of serially inputting the variable length coding data and the run length coding data;

a step of serially decoding the inputted variable length coding data and run length coding data in a state in which "RUN" representing number of "0" and "LEVEL" representing a magnitude of a coefficient value are combined;

a step of retaining an address of the "LEVEL" corresponding to the "RUN" based on the number of "0" indicated by the "RUN";

a step of storing the "LEVEL" in a data buffer based on the address;

a step of reading the "LEVEL" from the data buffer based on the address;

a step of selecting one of the "LEVEL" stored in the data buffer and "0" based on the address and outputting the selected data;

a step of executing a post-stage processing to the selected data; and a step of outputting the post-stage-processed data.

According to the foregoing method, the data read operation and the data output from the selecting unit can be controlled by judging based on the address. Thereby, only the "LEVEL" is read based on the address, and the number of the accesses with respect to the data buffer can be reduced. As a result, the variable length decoding device consuming less power can be provided.

A variable length decoding method according to the present invention comprises:

a step of serially decoding inputted data in a state in which "RUN" representing number of "0" and "LEVEL" representing a magnitude of a coefficient value are combined;

a step of calculating and adding an address of the "LEVEL" corresponding to the "RUN" based on the number of "0" indicated by the "RUN";

a step of storing information showing the address adding result;

a step of storing the "LEVEL" in a first data buffer based on the address adding result;

a step of reading the "LEVEL" from the first data buffer based on information stored in an information register if a second data buffer is in a writable state;

a step of selecting one of the "LEVEL" stored in the first data buffer and "0" based on the information stored in the information register;

a step of storing data selected in a selecting unit in the second data buffer;

a step of reading the data from the second data buffer;

a step of executing a post-stage processing to the data read from the second data buffer; and a step of outputting the post-stage-processed data.

According to the foregoing method, the data of the first data buffer can be outputted without waiting for the processing of the post-stage processing unit to be completed, which allows the next variable length decoding to be soon executed. As a result, the decoding process can be further accelerated.

In the variable length decoding method according to the present invention, the decoded "LEVEL" is serially closely stored in the first data buffer in the order of smaller addresses, and then scan-converted at the time of the write operation with respect to the second data buffer or at the time of the read operation with respect to the second data buffer.

According to the foregoing method, it becomes unnecessary to calculate the address in the first data buffer, and the data buffer can be thereby more easily accessed.

A variable length decoding method according to the present invention comprises:

a step of serially decoding inputted data in a state in which "RUN" representing number of "0" and "LEVEL" representing a magnitude of a coefficient value are combined;

a step of calculating and adding an address of the "LEVEL" corresponding to the "RUN" based on the number of "0" indicated by the "RUN";

a step of storing information showing the address adding result;

a step of storing the "LEVEL" in a first data buffer based on the address adding result;

a step of transferring a DC coefficient:

a step of judging a characteristic of decoding data based on the DC coefficient;

a step of reading the "LEVEL" from the first data buffer based on information stored in an information register if a second data buffer is in a writable state;

a step of selecting one of the "LEVEL" stored in the first data buffer and "0" based on the information stored in the information register;

a step of storing data selected in a selecting unit in the second data buffer;

a step of reading the data from the second data buffer in the data arrangement order determined by the judged characteristic of the decoding data;

a step of executing a post-stage processing to the data read from the second data buffer; and a step of outputting the post-stage-processed data.

According to the foregoing method, the decoding process can be executed at a higher rate in the variable length decoding process having a plurality of scanning modes such as MPEG-4.

The variable length decoding method according to the present invention preferably further comprises:

a step of storing a result of a first information register in a second information register;

a step of storing the "LEVEL" read from the first data buffer in the second data buffer;

a step of reading the "LEVEL" from the second data buffer based on the value of the second information register; and a step of selecting one of the "LEVEL" stored in the second data buffer and "0" based on the value of the second information register, wherein the "LEVEL" outputted from the first data buffer is stored in the second data buffer if the second data buffer is in the writable state.

According to the foregoing method, only the "LEVEL" is transferred between the first and second data buffers, as a result of which the variable length decoding can be executed at a higher rate.

The variable length decoding method according to the present invention preferably further comprises a step of initializing the second data buffer, wherein the second data buffer is initialized after the read operation with respect to the second data buffer is completed.

According to the foregoing method, the selecting unit for selecting one of the "LEVEL" and "0" from the first data buffer can be omitted, and only the "LEVEL" is transferred between the first and second data buffers. The variable length decoding can be thereby accelerated.

In the variable length decoding method according to the present invention, the information register preferably has a bit length corresponding to at least one block to be decoded, and a memory comprising a write port and a read port capable of independently reading the data constitutes the data buffer, and the followings are further provided:

a step of closely storing the "LEVEL" in the data buffer in the order of smaller addresses;

a step of starting the read operation as soon as at least one "LEVEL" is stored in the data buffer;

a step of judging whether or not a position at which the "LEVEL" to be decoded is written in the data buffer corresponds to a position at which the "LEVEL" is allowed to be read and written;

a step of temporarily halting the decoding when the write position does not correspond to the position at which the "LEVEL" is allowed to be written; and a step of restarting the decoding when the write operation is allowed.

When the write operation and the read operation are simultaneously executed according to the foregoing method, the data can be transferred without waiting for the read operation with respect to the data buffer to be completed. Thereby, the processing time of the variable length decoding can be reduced, as a result of which the decoding process can be generally executed at a higher speed.

A first image pickup system according to the present invention comprises:

an image processing circuit including any of the aforementioned variable length decoding devices, the image pickup device executing an image processing;

a sensor for outputting an image signal to the image processing circuit; and an optical system for image-forming a light on the sensor.

According to the foregoing constitution, a higher speed can be expected in the image processing along with the higher-speed variable length decoding.

A second image pickup system according to the present invention further comprises a converter for converting the image signal obtained from the sensor into a digital signal and supplying the digital signal to the image processing circuit in the constitution of the first image pickup system.

According to the foregoing constitution, advantages of a digital signal processing can be exerted.

BRIEF DESCRIPTION OF THE DRAWINGS

The present invention is illustrated be way of example and not limitation in the figures of the accompanying drawings, in which like references indicate similar elements and in which:

FIG. 5 is a block diagram illustrating another constitution of the variable length decoding device according to the first preferred embodiment (provided with a clock control feature);

FIG. 16 is a flow chart of a basic decoding process of MPEG-4.

FIG. 18 shows an example of a horizontal-prioritized scan according to the third preferred embodiment;

FIG. 19 shows an example of a vertical-prioritized scan according to the third preferred embodiment;

FIG. 33 is an illustration of a data storing method according to the ninth preferred embodiment;

DESCRIPTION OF THE INVENTION

Figure 1:
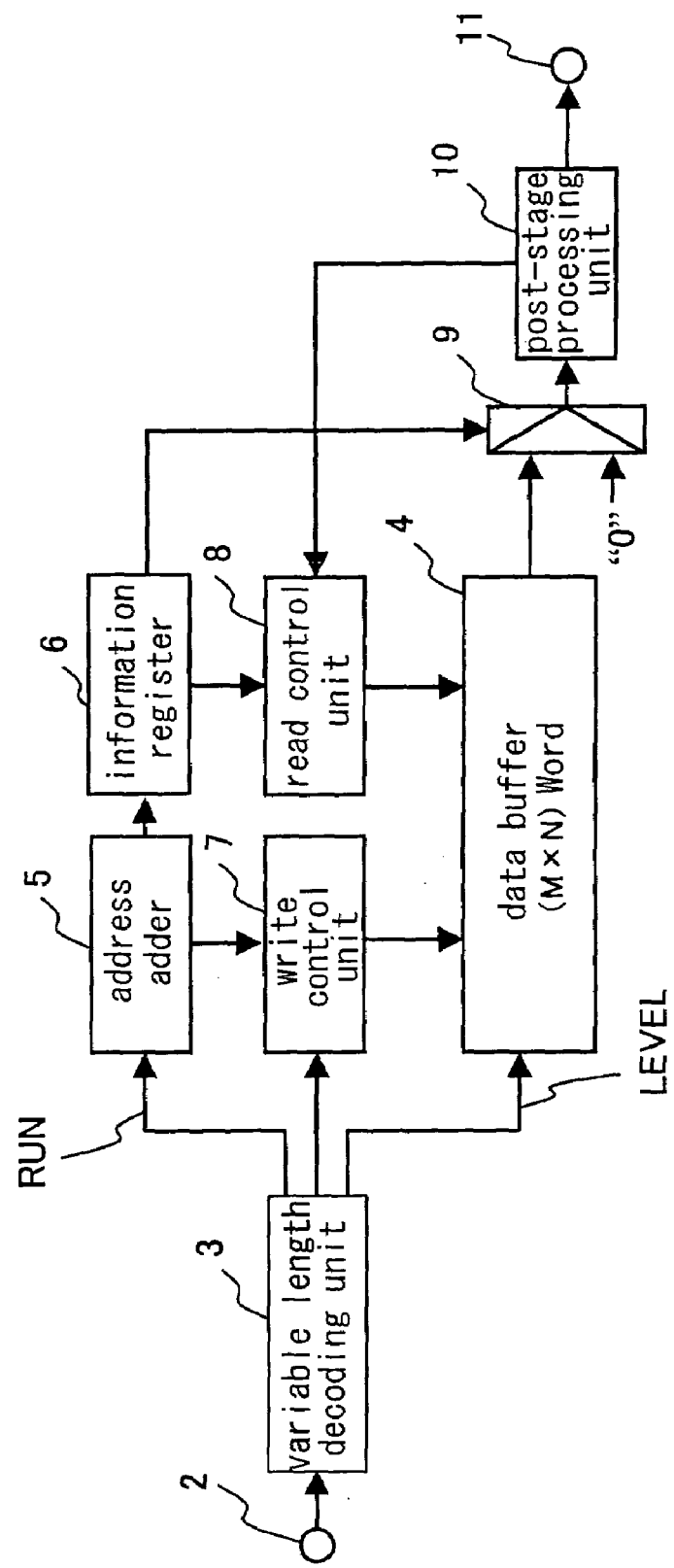
FIG. 1 is a block diagram illustrating a constitution of a variable length decoding device according to a first preferred embodiment of the present invention.

Hereinafter, preferred embodiments of the present invention are described referring to the drawings.

First Preferred Embodiment

A variable length decoding device according to a first preferred embodiment of the present invention is described referring to the drawings.

FIG. 1 shows a schematic constitution of a variable length decoding device according to the first preferred embodiment. The present embodiment is described referring to a case in which one block includes 8×8 number of data.

Referring to reference numerals in FIG. 1, 2 denotes an input unit for inputting variable length coding/run length coding data, 3 denotes a variable length decoding unit for serially decoding the data inputted from the input unit 2 in a state in which "RUN" representing number of "0" and "LEVEL" representing a magnitude of a coefficient value are combined, 4 denotes a data buffer for storing the "LEVEL", 5 denotes an address adder for calculating an address of the "LEVEL" corresponding to the "RUN" based on the number of "0" indicated by the "RUN", 6 denotes an information register of m×n bits for memorizing the result obtained by the address adder 5, 7 denotes a write control unit for storing the "LEVEL" in the data buffer 4 based on the information from the address adder 5, 8 denotes a read control unit for reading the "LEVEL" from the data buffer 4 based on the value of the information register 6, 9 denotes a selecting unit for selecting one of the "LEVEL" stored in the data buffer 4 and "0" based on the value of the information register 6 and outputting the selected data, 10 denotes a post-stage processing,unit for executing a post-stage processing to the data from the selecting unit 9, and 11 denotes an output unit for outputting the data from the post-stage processing unit 10.

Figure 2:
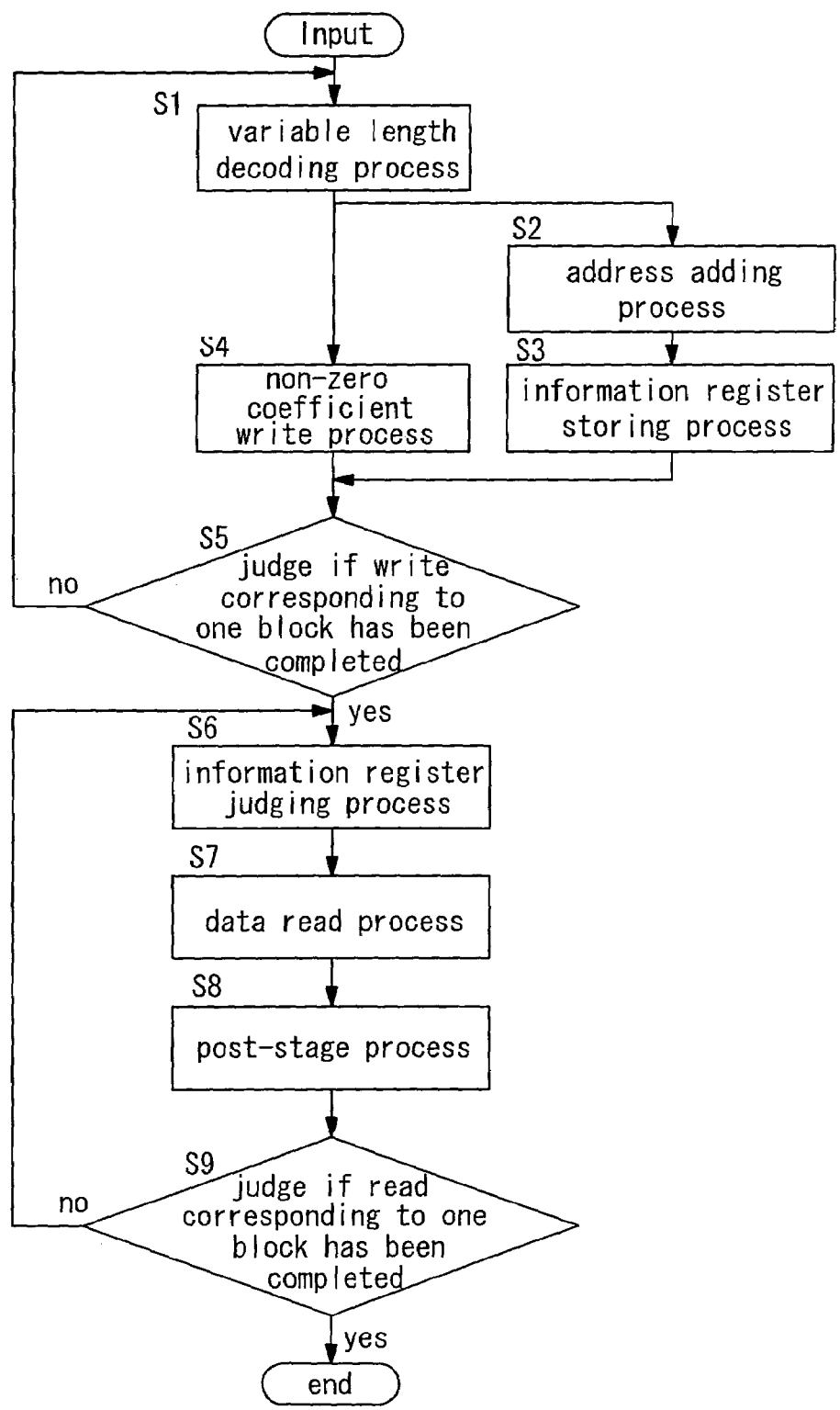
FIG. 2 is a flow chart of an operation of the variable length decoding device according to the first preferred embodiment.

FIG. 2 is a flow chart of an operation of the variable length decoding device according to the first preferred embodiment. Referring to FIG. 2, the processing flow is described.

The variable length coding/run length coding data is inputted from the input unit 2. The inputted data is serially decoded in the variable length decoding unit 3 in the state in which the "RUN" representing the number of "0" and the "LEVEL" representing the magnitude of the coefficient value are combined (Step S1).

Figure 38:
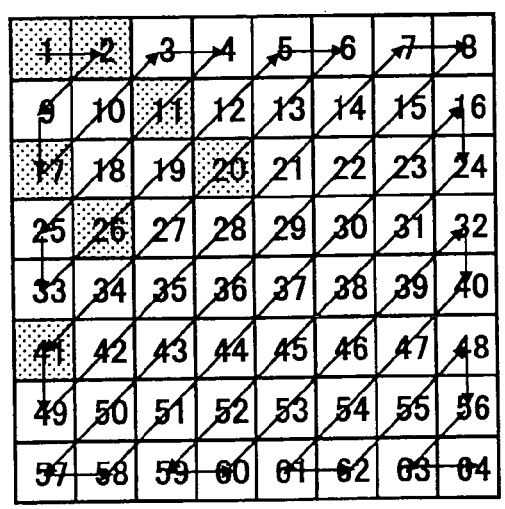
FIG. 38 is an illustration of a post-decoding quantization DCT coefficient and a zigzag scan.
Figure 39:
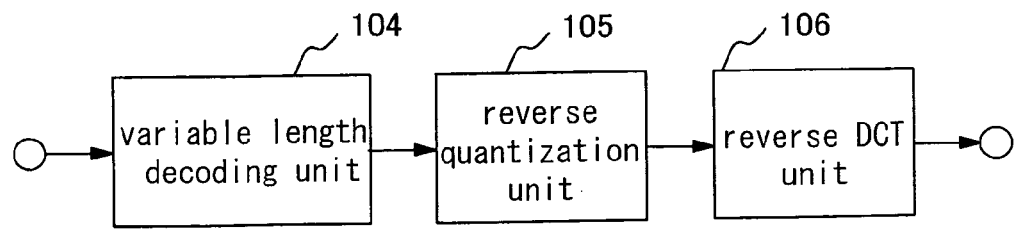
FIG. 39 is a block diagram illustrating a constitution of a typical image decoding device.
Figure 40:
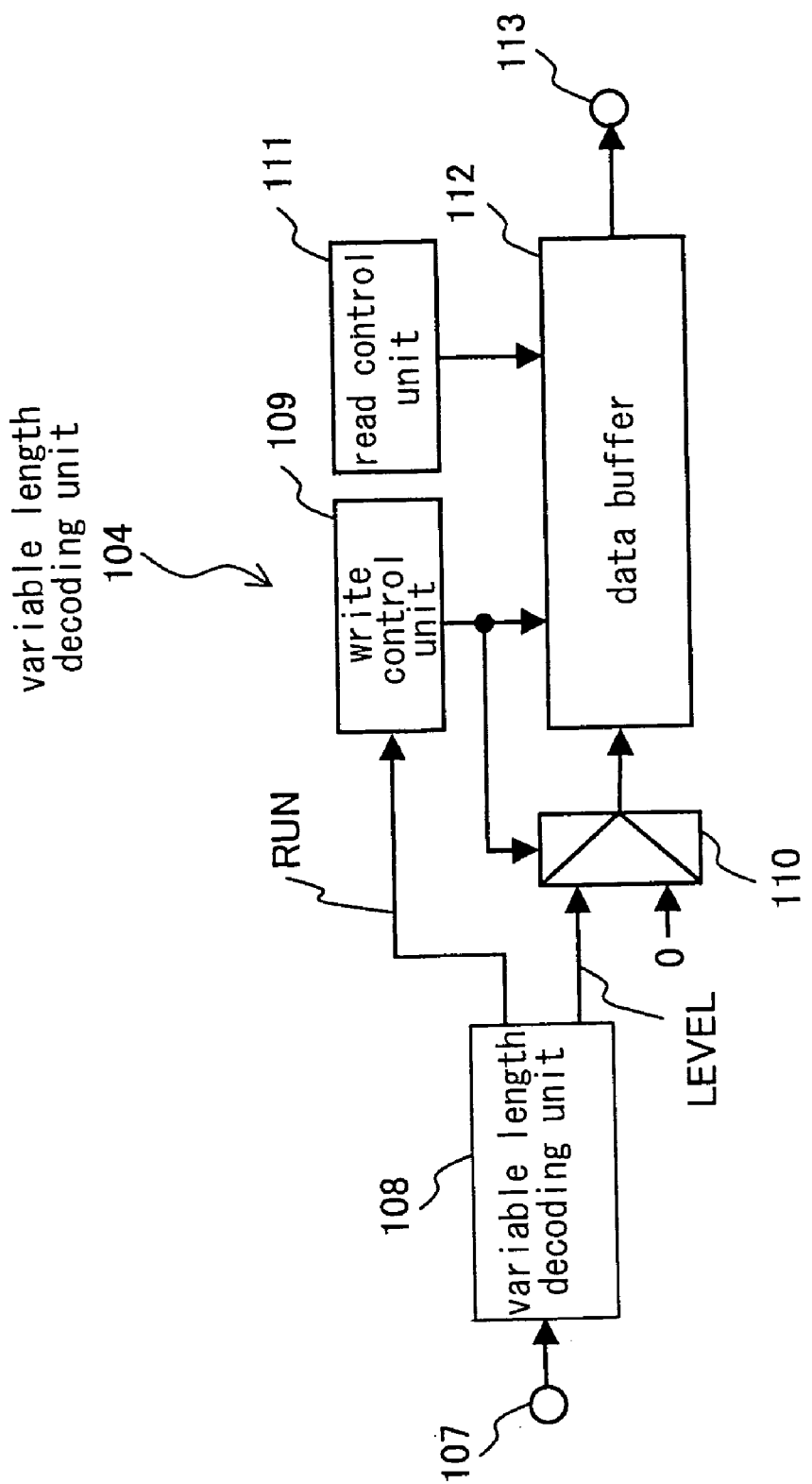
FIG. 40 is a block diagram illustrating a constitution of a variable length decoding unit according to a conventional technology.
Figure 41:
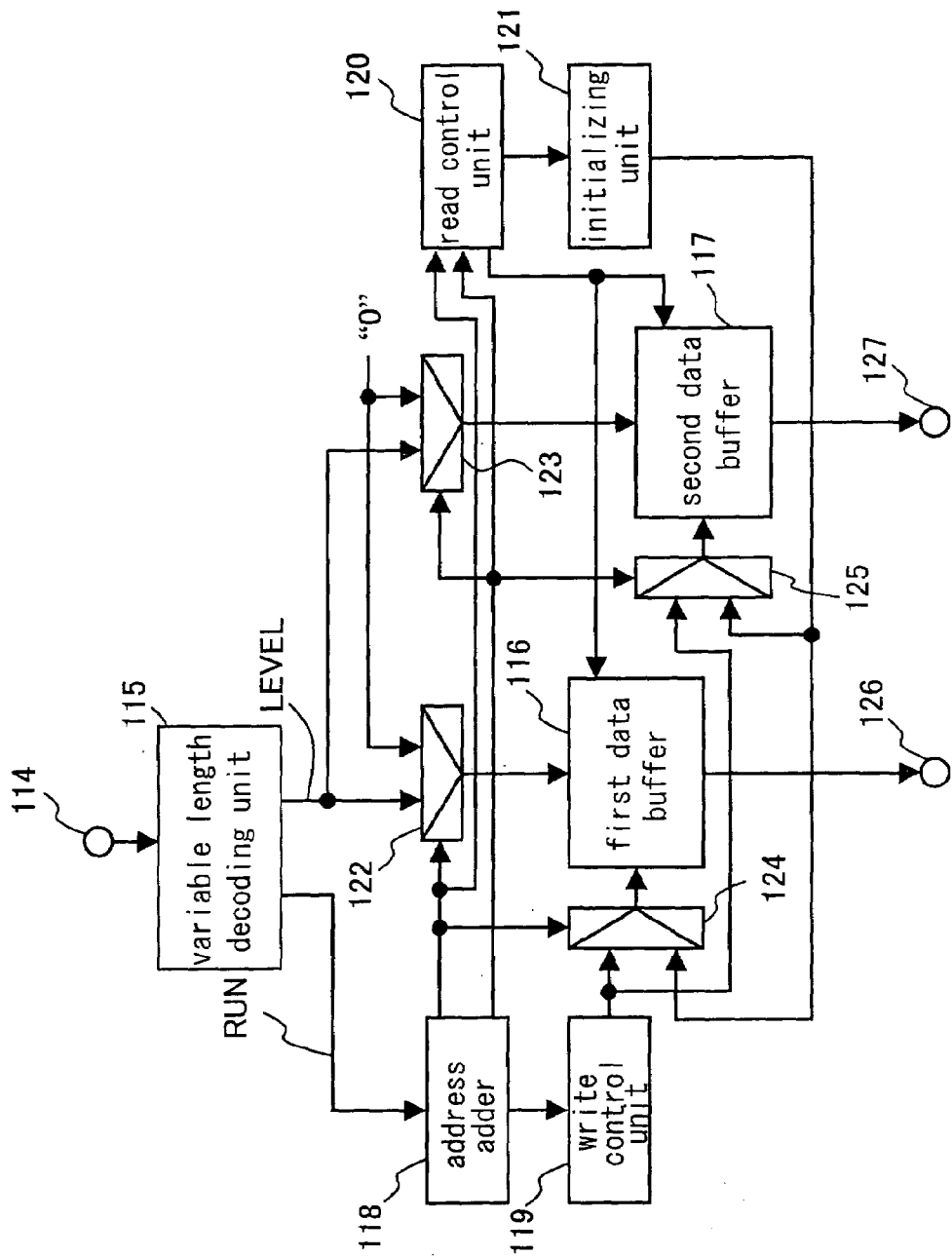
FIG. 41 is a block diagram illustrating a constitution of a decoding circuit for decoding a run length coding according to the conventional technology.

The address adder 5 calculates the address in the order of the zigzag scan shown in FIG. 38, that is, in the order of 1→2→9→17 . . . based on the magnitude of the decoded "RUN (Step S2).

Figure 3:
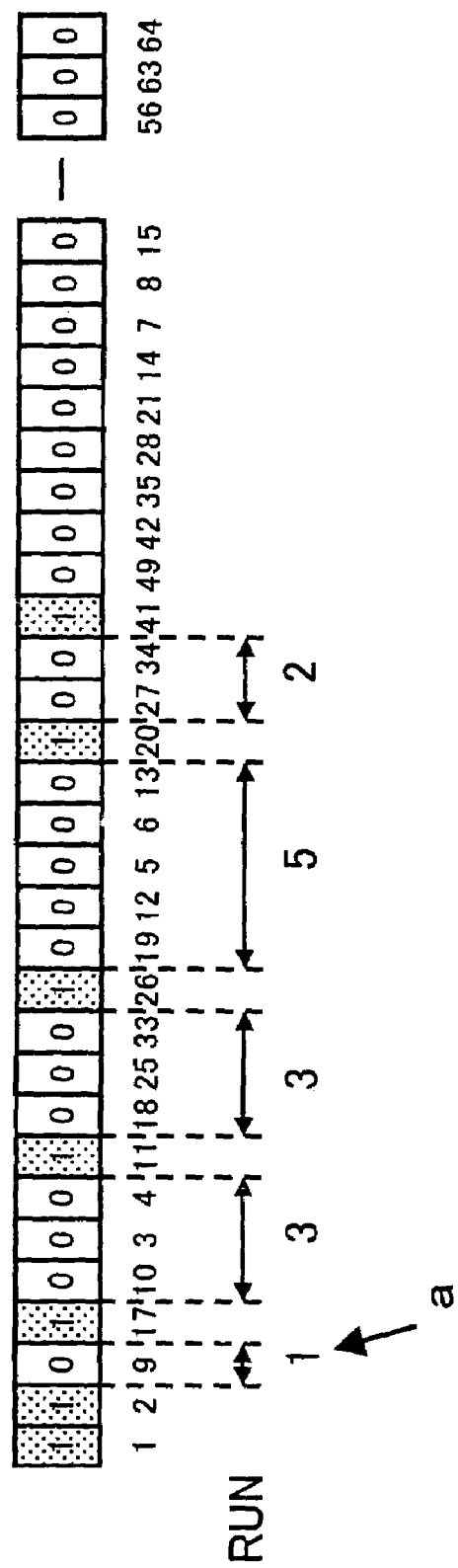
FIG. 3 is an illustration of an information register according to the first preferred embodiment.

As shown in FIG. 3, in the information register 6, "0" corresponding to the magnitude of the "RUN", for example, is consecutively memorized in the order of the zigzag scan, and, "1", for example, is memorized as the address of the "LEVEL" at a position subsequent to the positions of "0" (Step S3).

The write control unit 7 writes the "LEVEL" at the address obtained by the address adder 5 (Step S4).

It is judged whether or not the write of the "LEVEL" corresponding to one block is completed. The processing returns to the Step Si when the write operation has not been completed, and advances to the read operation upon the completion of the write operation (Step S5).

Figure 4:
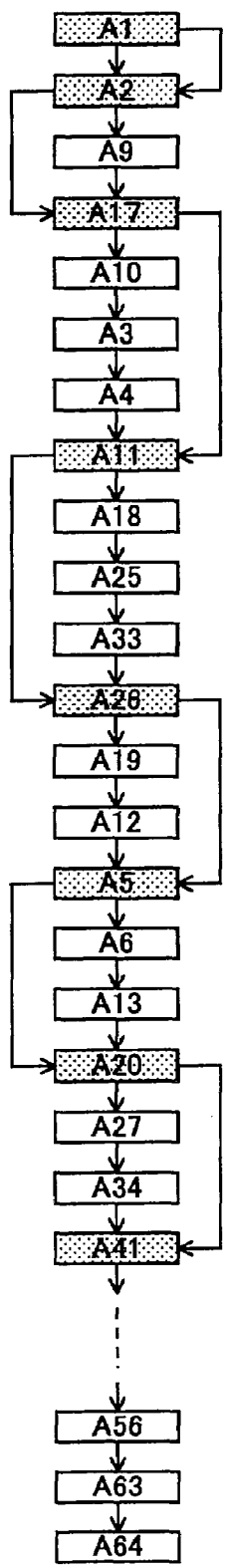
FIG. 4 is an illustration of a read address shift according to the first preferred embodiment.

In the variable length decoding unit 3, the data is decoded in the state in which the "RUN" and the "LEVEL" corresponding to one block are combined. When the write of the "LEVEL" is completed (YES in the Step S5), the read control unit 8 receives a control signal indicating permission of the read operation with respect to the post-stage processing unit 10 to thereby judge the information register (Step S6), and outputs the address corresponding to a bit in which "1" is stored in the information register 6 to the data buffer 4 to thereby read the "LEVEL" stored at the address (Step S7). The address shifts, for example, as shown in FIG. 4. The selecting unit 9, as soon as the read control unit 8 judges the information register 6, outputs "0" to the post-stage processing unit 10 when the bit of the information register 6 is "0", while outputting the "LEVEL" as the output data from the data buffer 4 when the bit is "1" (Step S7).

The post-stage processing unit 10 executes the post-stage processing to the data from the selecting unit 9 (Step S8), and outputs the processed data from the output unit 11 (Step S9).

Judgment of Information Register

The respective bits of the information register 6 are simultaneously judged, and the addresses corresponding to the bits in which "1" is stored in the information register 6 are serially outputted to the data buffer 4 from the read control unit S. In the selecting unit 9, "0" as many as the values of the information register 6 showing "0" (interval a shown in FIG. 3) may be outputted to the post-stage processing unit 10.

Clock Control

As shown in FIG. 5, a clock control unit 12 for controlling a clock supply with respect to the data buffer 4 based on the value of the information register 6 may be further provided.

Read Enable Control

Figure 6:
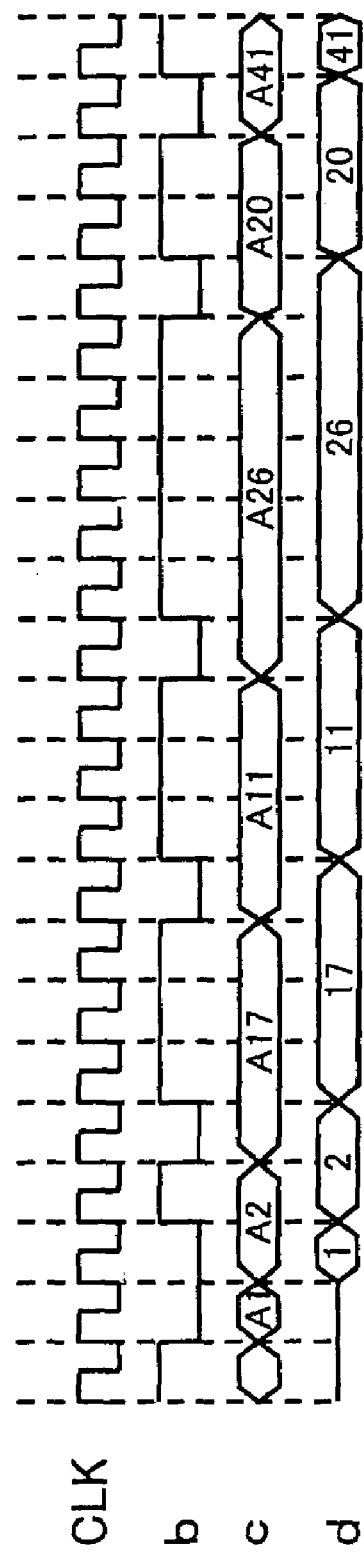
FIG. 6 is a timing chart of the operation of the variable length decoding device according to the first preferred embodiment.

As shown in FIG. 6, a read signal b with respect to the data buffer 4 may be controlled based on the value of the information register 6.

Address Memorization

Figure 7:
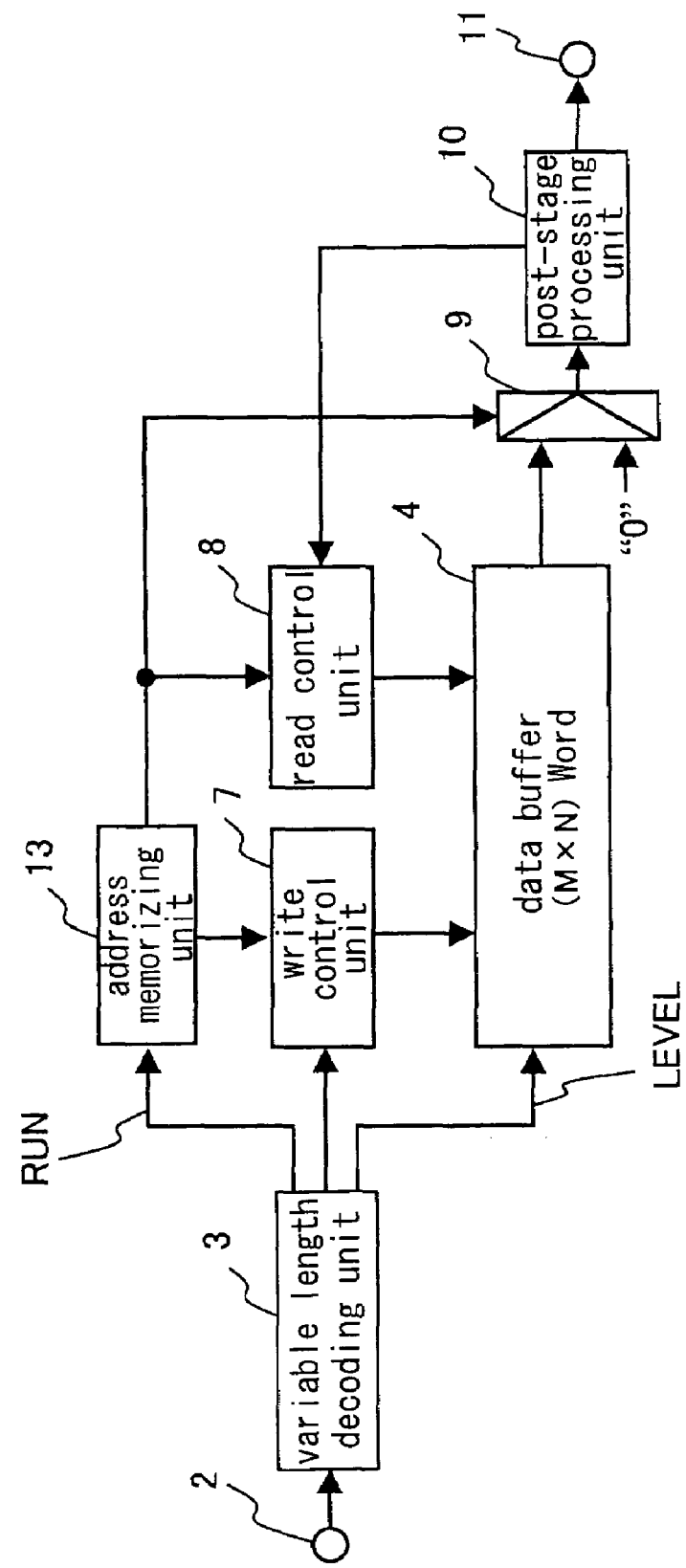
FIG. 7 is a block diagram illustrating still another constitution of the variable length decoding device according to the first preferred embodiment (provided with an address memorizing unit)

As shown in FIG. 7, an address memorizing unit 13 may be provided in place of the address adder 5 and the information register 6, in which case the address of the "LEVEL" written in the data buffer 4 based on the "RUN" is memorized in the address memorizing unit 13. In the address memorizing unit 13, the address is calculated in the order of the zigzag scan shown in FIG. 38, that is, in the order of 1→2→9→17 . . . .

The read control unit 8 serially reads the data from the data buffer 4. The selecting unit 9 reads the data from the data buffer 4 only when the data read from the data buffer 4 is the data at the address memorized in the address memorizing unit 13, while outputting "0" otherwise.

According to the present embodiment constituted as described, the following effects can be exerted.

The variable length decoding device achieving a higher speed can be provided because only the "LEVEL" from the variable length decoding unit 3 is written.

In the selecting unit 9, only the necessary data is outputted based on the judgment based on the value of the information register 6 in the selecting unit 9 when the data is read. Therefore, it becomes unnecessary to initialize the data buffer, which was required in the conventional technology. As a result, a circuit downsizing can be realized.

In the case of supplying the clocks corresponding to the number of the data not showing "0" to the data buffer 4 based on the value of the information register 6, power consumption can be controlled. As a result, the processing can be executed with less power.

In the case of supplying the read control signals corresponding to the number of the data not showing "0" to the data buffer 4 based on the value of the information register 6, power consumption can be controlled. As a result, the processing can be executed with less power.

Second Preferred Embodiment

A variable length decoding device according to a second preferred embodiment of the present invention is described referring to the drawings.

Figure 8:
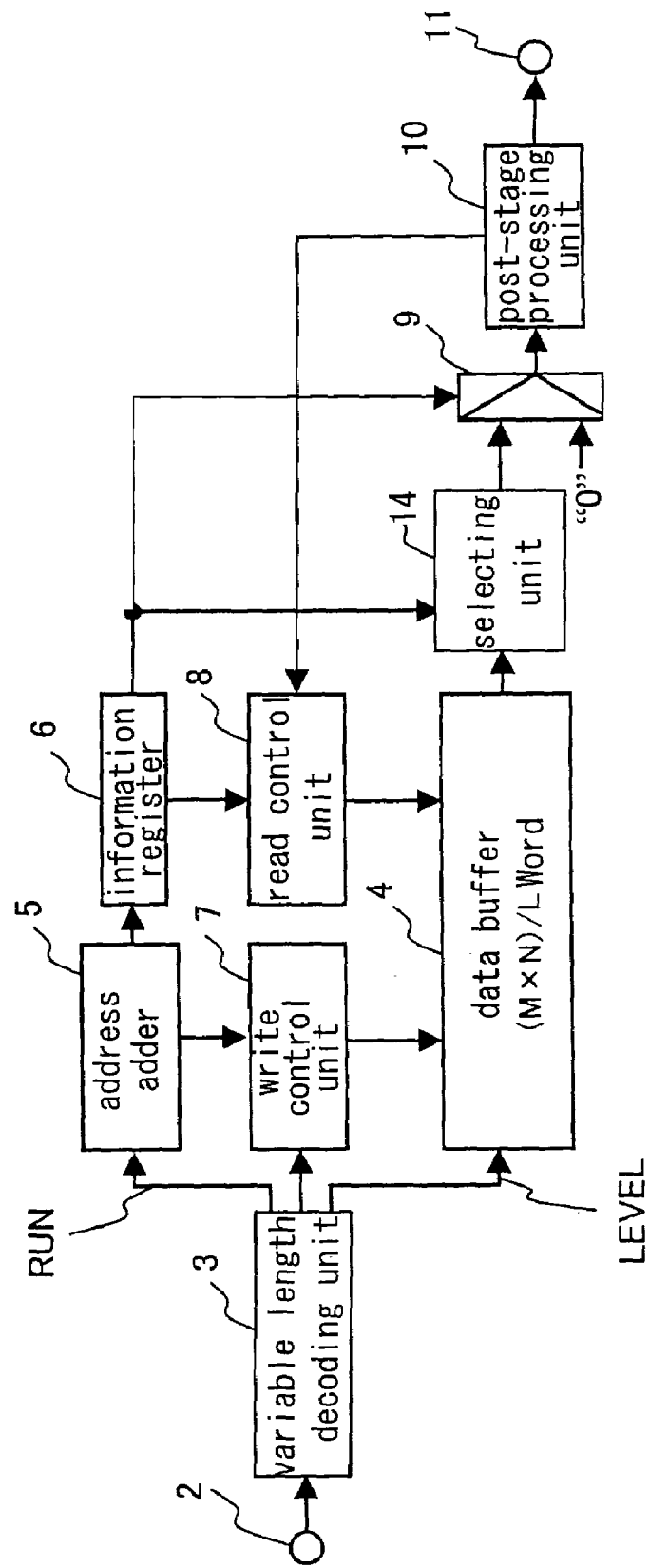
FIG. 8 is a block diagram illustrating a constitution of a variable length decoding device according to a second preferred embodiment of the present invention.

FIG. 8 shows a schematic constitution of the variable length decoding device according to the second preferred embodiment. Any component shown in FIG. 8, which is constituted in a similar manner as in the first preferred embodiment, is indicated by the same numeral and not described here again.

The variable length decoding device according to the present embodiment is constituted in such manner that the data buffer 4 is adapted to store the two "LEVEL" from the variable decoding unit 3 at one address, and a second selecting unit 14 for selecting the data outputted from the data buffer 4 is further provided in the constitution of the variable length decoding device according to the first preferred embodiment.

An operation of the variable length decoding device according to the present embodiment is described referring to the drawings. The present embodiment is described referring to the case in which one block includes 8×8 number of data.

Operations of the input unit 2, variable length decoding unit 3 and address adder 5 are the same as the operations thereof described in the first preferred embodiment.

Figure 9:
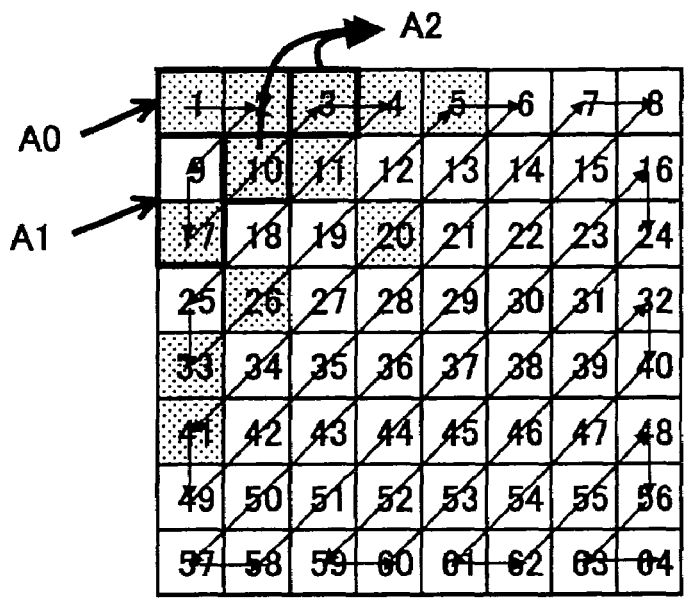
FIG. 9 is an illustration of a data storing method and a constitution of a data buffer according to the second preferred embodiment.
Figure 10:
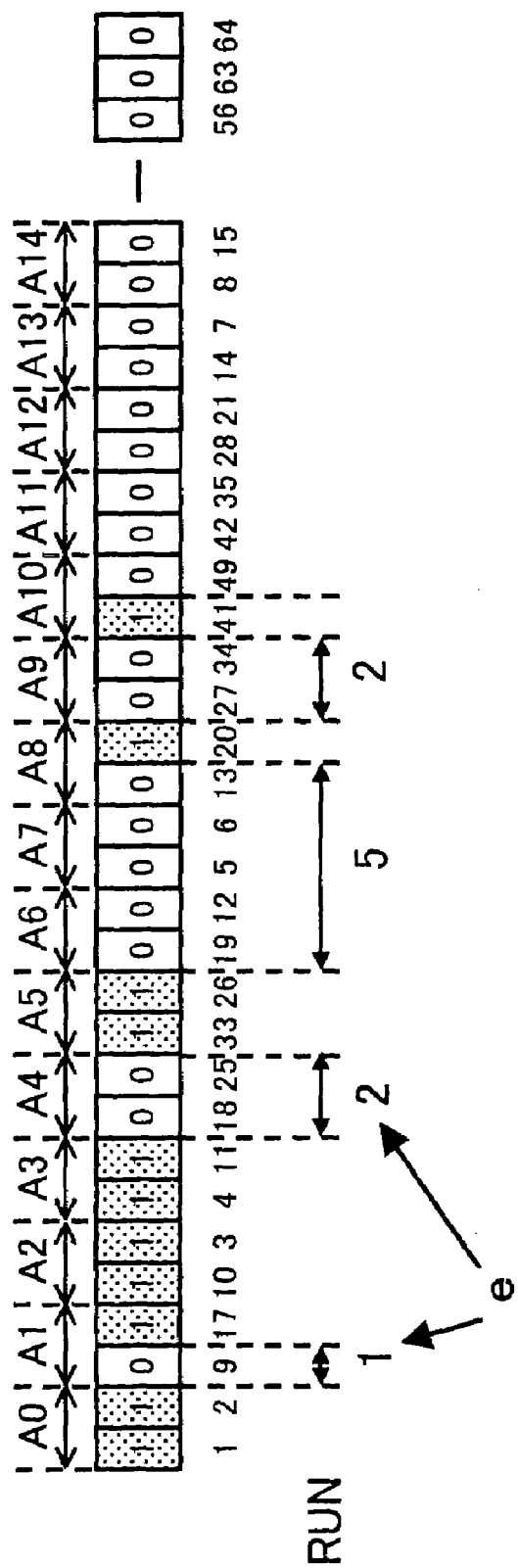
FIG. 10 is an illustration of an information register according to the second preferred embodiment.

As shown FIGS. 9 and 10, a write control unit 7 collectively memorizes the two data from the variable length decoding unit 3 a tone address in a data buffer 4. To describe a method of storing the data at one address, the data having smaller numbers are stored on as an upper-level side, while the data having larger numbers are stored on a lower-level side with an upper-left corner of the 8×8 block being "1" and an upper-right corner thereof being "64".

In the variable length decoding unit 3, the data is decoded in the state in which the "RUN" and the "LEVEL" corresponding to one block are combined. After the "LEVEL" is written, a read control unit 8 receives a control signal indicating permission of the read operation with respect to a post-stage processing unit 10 to thereby simultaneously judge the information register 6 in two bits. The addresses corresponding to the bits, one or none of which is not "0", are outputted, and the "LEVEL" stored at the addresses (corresponding to two data in this case) are read from the data buffer 4. The second selecting unit 14, as soon as the read control unit 8 judges the information register 6, outputs the upper level of the data from the data buffer 4 when the upper levels of the two bits are "1", while outputting the lower "LEVEL" of the data from the data buffer 4 when the lower levels of the bits are "1". Operations of a selecting unit 9, the post-stage processing unit 10 and an output unit 11 thereafter are the same as described in the first preferred embodiment.

According to the present embodiment offering the foregoing constitution, the following effects are exerted.

The data buffer 4 stores the plurality of data at one address, and the read control unit 8 simultaneously judges the information register 6 in the plurality of bits. Accordingly, the data having the consecutive values not showing "0" can be read at the same time, which shortens an access time with respect to the data buffer 4. As a result, the variable length decoding device consuming less power can be provided.

In the present embodiment, the two data are stored at one address in the data buffer 4, however, more than two data may be stored at one address.

Third Preferred Embodiment

A variable length decoding device according to a third preferred embodiment of the present invention is described referring to the drawings.

Figure 11:
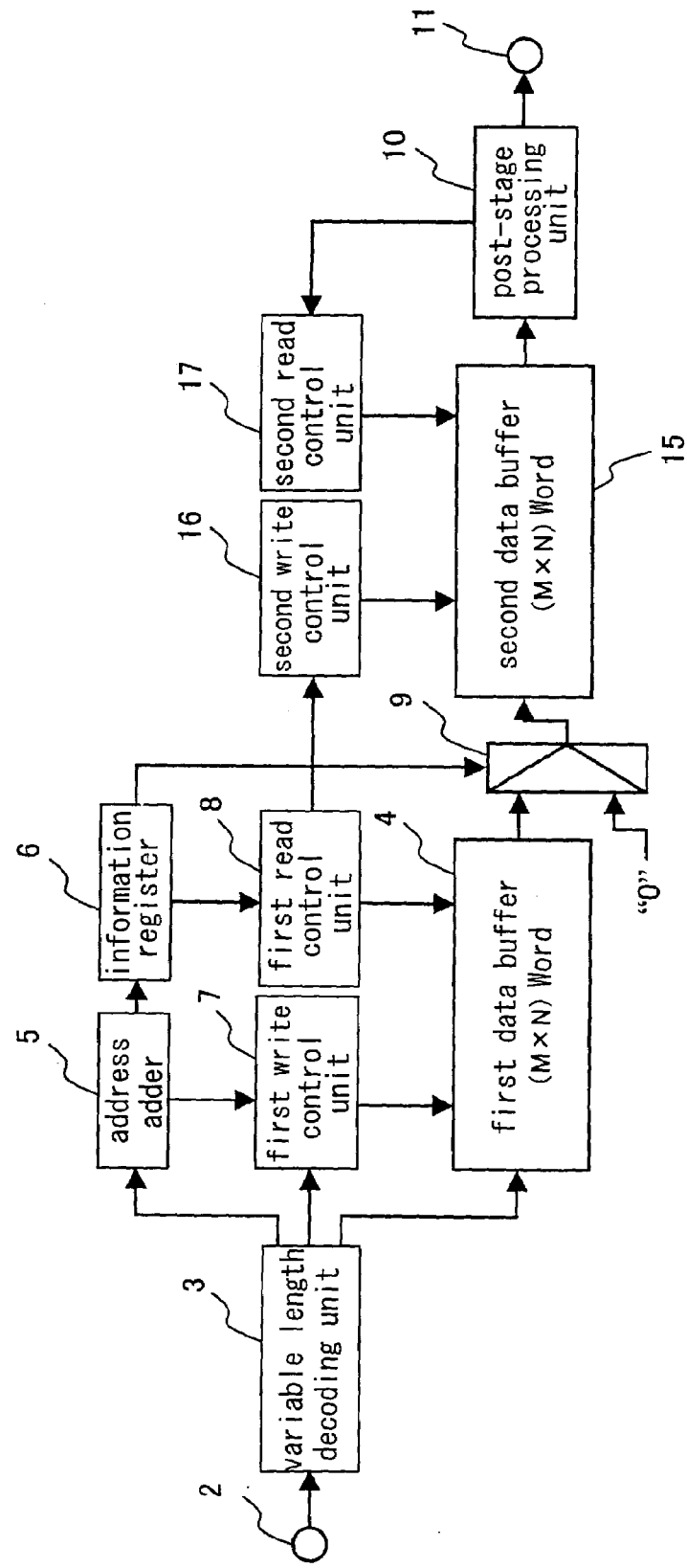
FIG. 11 is a block diagram illustrating a constitution of a variable length decoding device according to a third preferred embodiment of the present invention.

FIG. 11 shows a schematic constitution of the variable length decoding device according to the third preferred embodiment. Any component shown in FIG. 11, which is constituted in a similar manner as in the first preferred embodiment, is indicated by the same numeral and not described here again.

The variable length decoding device according to the present embodiment is constituted in such manner that a second data buffer 15, a second write control unit 16 and a second read control unit 17 are further provided in the constitution of the variable length decoding device according to the first preferred embodiment.

An operation of the variable length decoding device according to the present embodiment is described referring to the drawings. The present embodiment is described referring to the case in which one block includes 8×8 number of data.

Operations of the input unit 2, variable length decoding unit 3, first data buffer 4, address adder 5, information register 6, first write control unit 7, first read control unit 8 and selecting unit 9 are the same as the operations thereof described in the first preferred embodiment.

Figure 12:
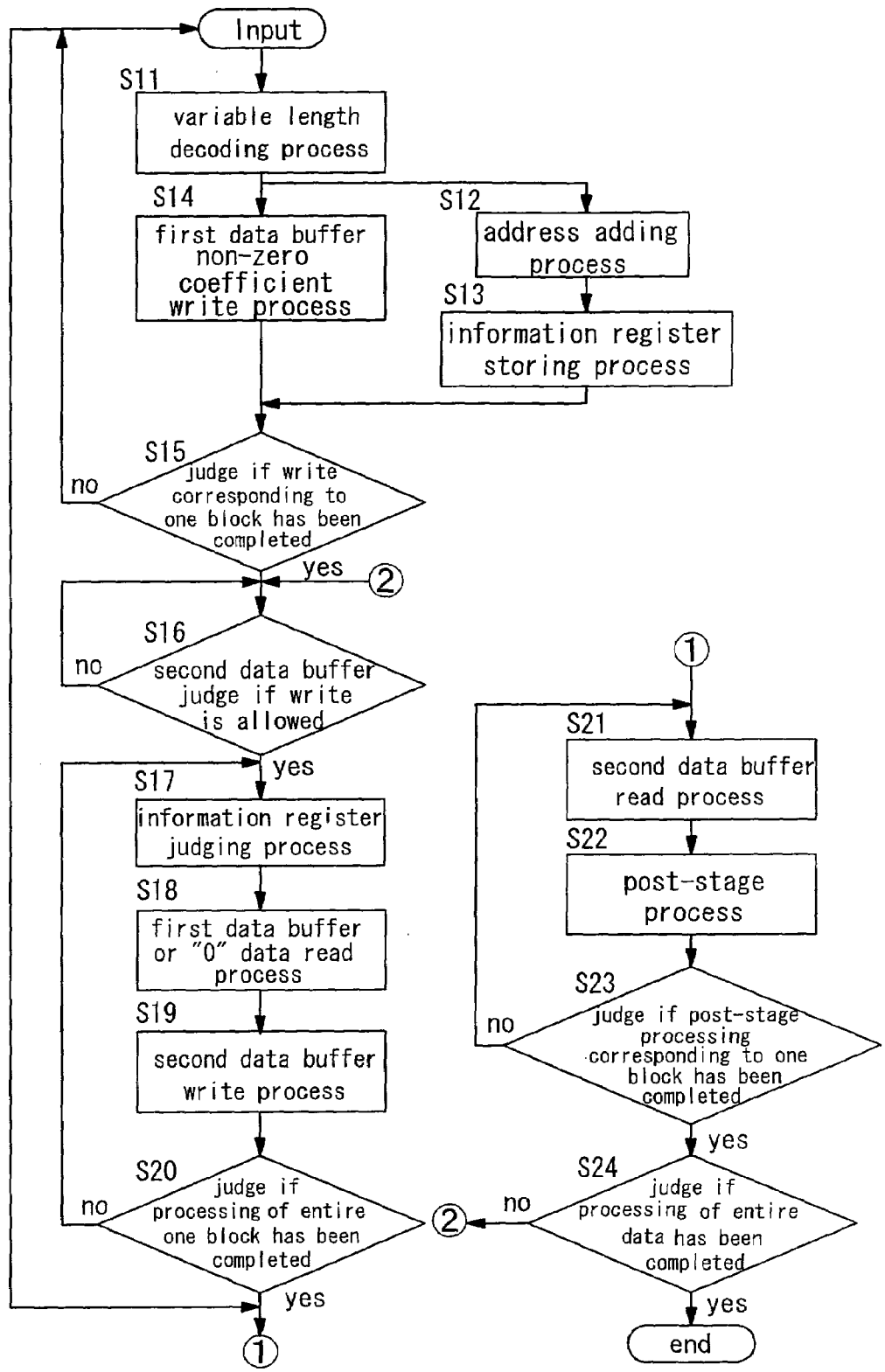
FIG. 12 is a flow chart of an operation of the variable length decoding device according to the third preferred embodiment.

FIG. 12 is a flow chart of an operation of the variable length decoding device according to the third preferred embodiment. Referring to FIG. 12, the processing flow is described.

In the variable length decoding unit 3, the data is decoded in the state in which the "RUN" and the "LEVEL" corresponding to one block are combined (Step S11). When the write of the "LEVEL" is completed (Steps S12 through S14), the first read control unit 8 judges the information register 6 (Steps S16 through S17), and, outputs the address corresponding to the bit in which "1" is stored in the information register 6 to the data buffer 4 to thereby read the "LEVEL" stored at the address (Step S18). The selecting unit 9, as soon as the first read control unit 8 judges the information register 6, outputs "0" to the second data buffer 15 when the bit of the information register 6 is "0", while outputting the "LEVEL" as the output data from the data buffer 4 when the bit is "1" (Step S18).

The second write control unit 16 writes the data from the selecting unit 9 in conjunction with the first read control unit 8 (Step S19).

When the write of the data corresponding to one block with respect to the second data buffer 15 is completed (YES in Step S20), the second read control unit 17 reads the data from the second data buffer 15 (Step S21), and outputs the read data to the post-stage processing unit 10 (Step S22). At the same time, the variable length decoding unit 3 starts to decode the next block (Step S11).

In the variable length decoding unit 3, the data is decoded in the state in which the "RUN" and the "LEVEL" corresponding to one block are combined (Step S11). If the post-stage processing unit 10 has completed the processing (YES in Step S23), the foregoing operation is repeated (Step S24). If the post-stage processing unit 10 has not completed the processing, the data transfer is suspended.

Constitution in Which Second Data Buffer is not Used

Figure 13:
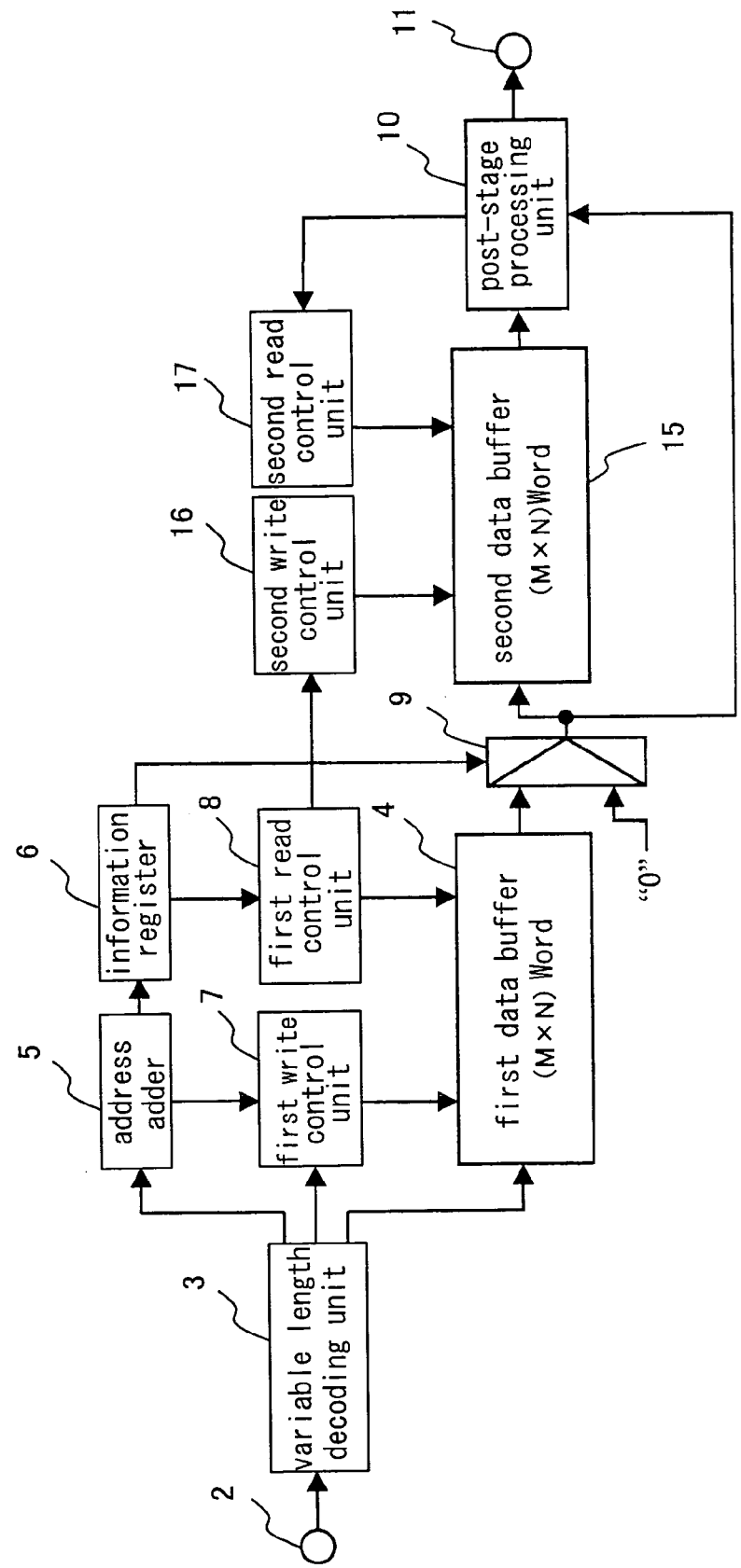
FIG. 13 is a block diagram illustrating a constitution of another variable length decoding device according to the third preferred embodiment.

As shown in the constitution of FIG. 13, the data outputted from the selecting unit 9 may be outputted not only to the second data buffer 15 but also to the post-stage processing unit 10.

According to the constitution described above, the following effects are exerted.

The data of the first data buffer 4 can be outputted without waiting for the processing of the post-stage processing unit 10 to be completed. As a result, the next variable length decoding can be soon executed, which further accelerates the decoding process.

The data from the selecting unit 9 can be outputted not only to the second data buffer 15 but also to the post-stage processing unit 10. As a result, when the processing of the post-stage processing unit 10 is executed earlier than the variable length decoding, the write operation with respect to the second data buffer 15 can be avoided, as a result of which the decoding process can be generally executed at a higher speed.

Close Data Storage in Data Buffer from Left

Figure 14:
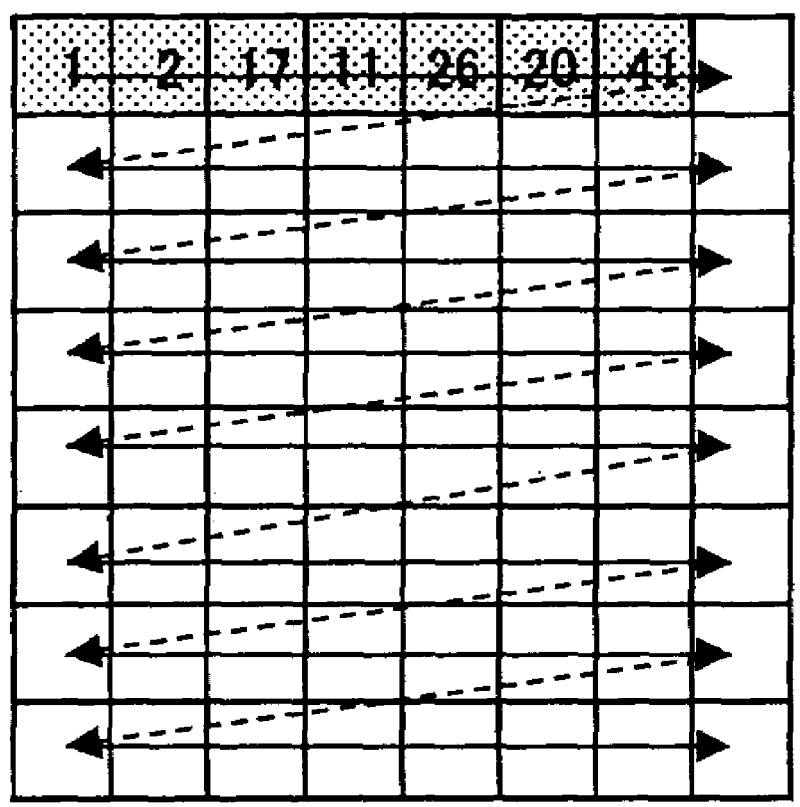
FIG. 14 is an illustration of data storing method according to the third preferred embodiment.
Figure 15:
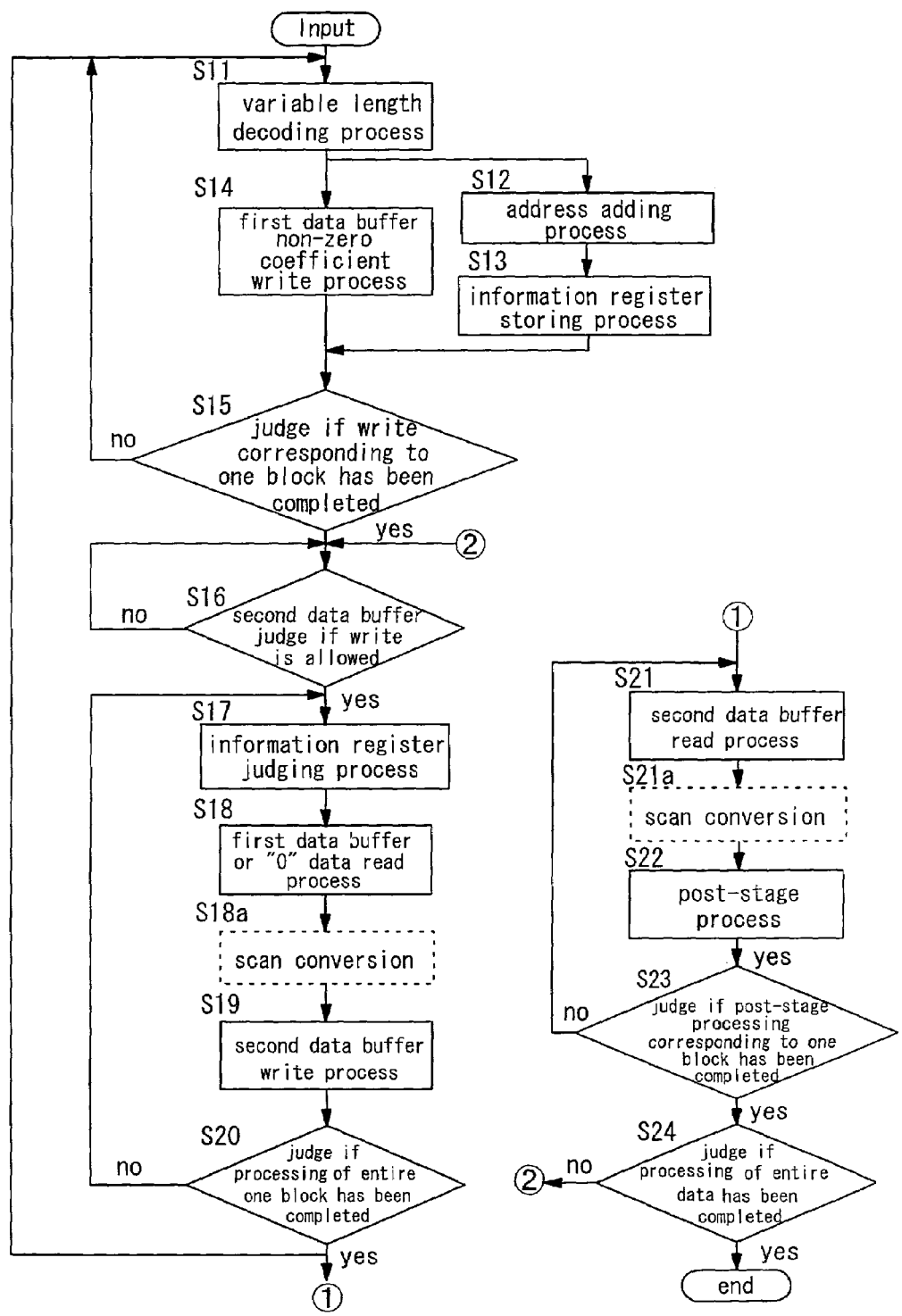
FIG. 15 is a flow chart of an operation of the variable length decoding device according to the third preferred embodiment (scan conversion)

As shown in FIGS. 14 and 15, when the data is stored in the first data buffer 4, the decoded "LEVEL" is closely stored from left in the order of smaller addresses. The stored data may be scan-converted when written in the second data buffer 15 (Step S18a) or may be scan-converted when read from the second data buffer 15 (Step S21a).

As a result, it becomes unnecessary to calculate the address in the first data buffer, which makes it easier to access the data buffer.

MPEG-4 Compliance Including DC Coefficient Transfer

In MPEG-4, a macro block formed from six block data each comprising 8×8 pixels is a processing unit, and four luminance component blocks and two color-difference component blocks constitute the macro block. There are two types of macro blocks, which are an intra-macro block coded based on predictions in image spaces equal to each other timewise and an inter-macro block coded based on predictions from images different to each other timewise.

As shown in FIG. 16, the macro block type is subjected to the variable length decoding (Step S31), and CBP (Coded Block Pattern) indicating whether or not all of the 8×8 data in the respective blocks are "0" is decoded (Step S32). The coefficient is decoded in the block in which the CBP is "1", while the coefficient is decoded as "0" in any block in which the CBP is "0" (Step S33).

Figure 17:
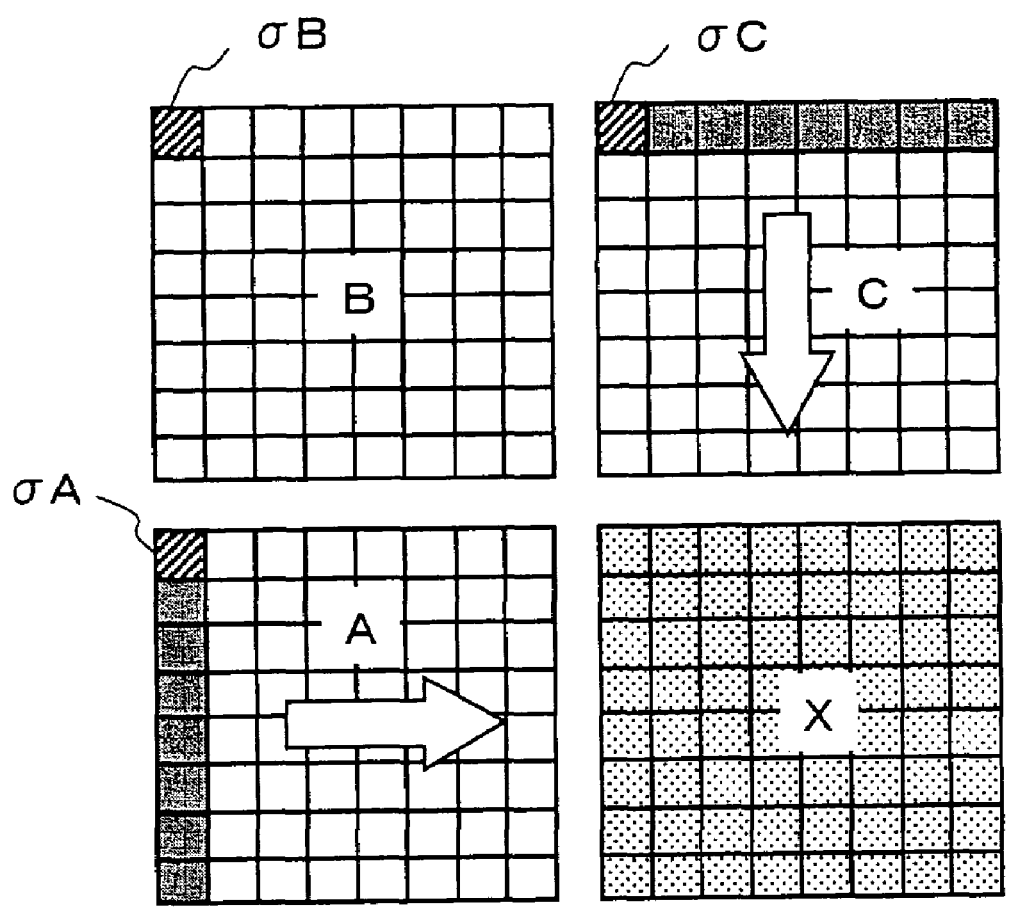
FIG. 17 is an illustration of DC/AC prediction.

As shown in FIG. 17, in the case of the intra-macro block, an optimum prediction bock is selected from the left-hand blocks or upper blocks of the blocks to be decoded, and a coding amount is reduced by obtaining a differential based on the determined block. In FIG. 17, a block X is the block to be decoded, and blocks A, B and C are already-decoded blocks adjacent to the block X. The blocks X, A, B and C are respectively comprised of a plurality of DCT coefficients.

A prediction block P of the block X is selected as in an expression 1.

$$\text{if}(|\sigma A - \sigma B| < |\sigma B - \sigma C|) \quad \text{Expression 1}$$

P=C else

P=A

σ A, σ B and σ C in the foregoing expression are DC coefficients of the respective blocks, and |z| denotes an absolute value of z. More specifically, gradients of the DC coefficients of the respective adjacent blocks A, B and C are calculated, and the block having a larger gradient is selected as the prediction block P of the block X to be decoded.

The MPEG-4, in addition to the prediction of the DC coefficient, includes a mode in which the prediction is also executed to an AC coefficient in order to execute the coding process more efficiently.

In the coding process through the prediction of the DC coefficient, of the coefficients of the prediction blocks elected as above, only the DC coefficient is to be predicted or the coding, and the coefficients are fixedly read by means f the zigzag scan in the coding.

In the coding process through the prediction of the AC coefficient, the scanning order is selected when the block to be decoded is subjected to the variable length coding depending on the result of the DC prediction. In addition to the zigzag scan shown in FIG. 38, for example, a horizontal-prioritized scan shown in FIG. 18 is selected when the prediction block is C, while a vertical-prioritized scan shown in FIG. 19 is selected when the prediction block is A.

As described, the prediction direction is determined based on the adjacent blocks, and the scanning order in the coding i.e. a zigzag scan as shown in FIG. 38, a horizontal-prioritized scan as shown in FIG. 18, a vertical-prioritized scan as shown in FIG. 19, is selected so as to execute the scan-conversion (Step S34). Then, an inverse quantization process (Step S35) and an inverse DCT processing (Step S36) are executed so that the decoding is successfully realized in the MPEG-4.

Figure 20:
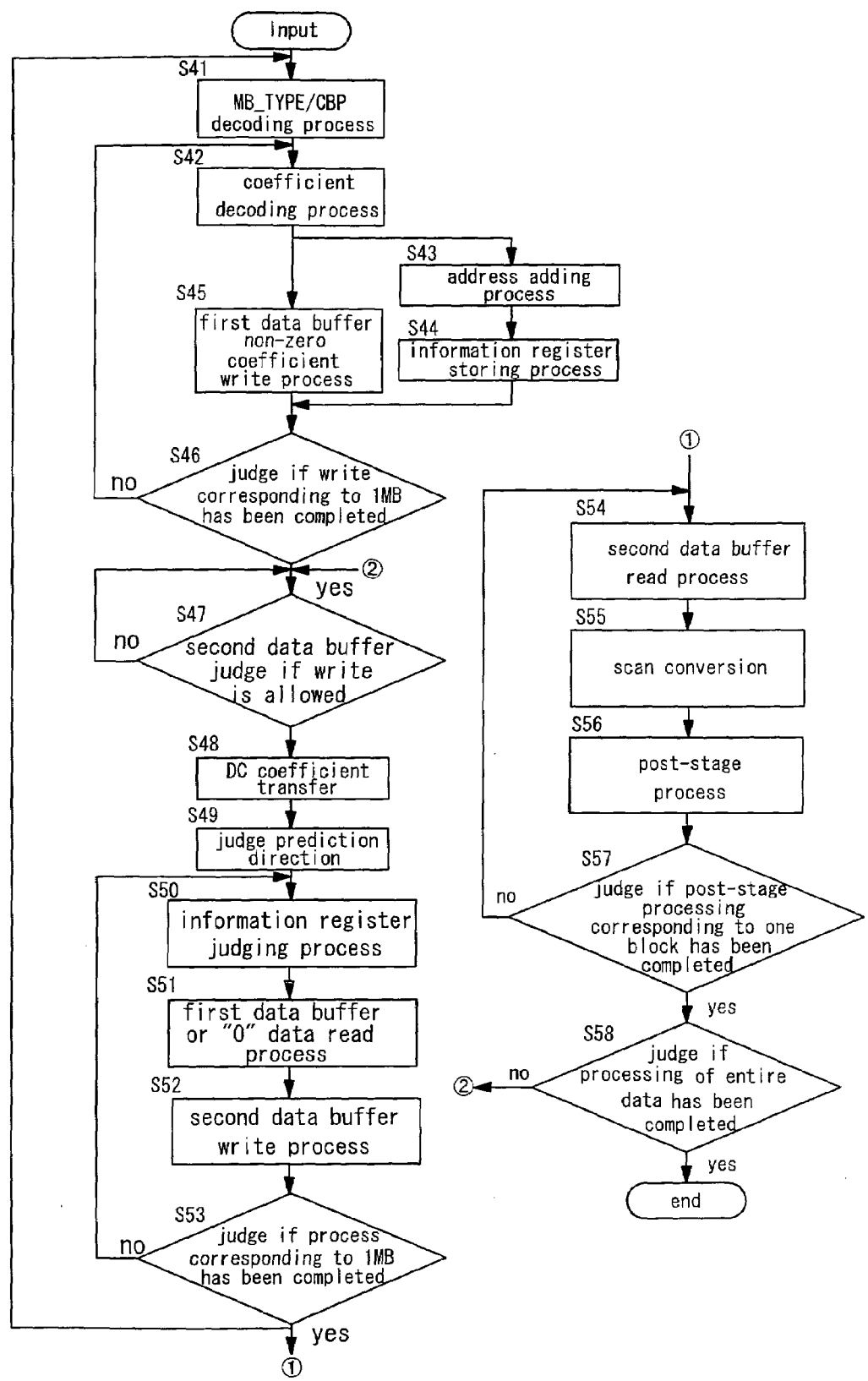
FIG. 20 is a flow chart of a MPEG-4 decoding process according to the third preferred embodiment.

FIG. 20 is a flow chart of the MPEG-4 compliant processing in the variable length decoding device according to the third preferred embodiment. The processing flow is described referring to FIG. 20.

The macro block type and the CBP with respect to the data inputted from the input unit 2 are subjected to the variable length decoding in the variable length decoding unit 3 (Step S41). Further, the coefficient is decoded (Step S42). Then, the data is serially decoded in the state in which the "RUN" representing the number of "0" and the "LEVEL" representing the magnitude of the coefficient value are combined (Steps S43 through S46).

Figure 21:
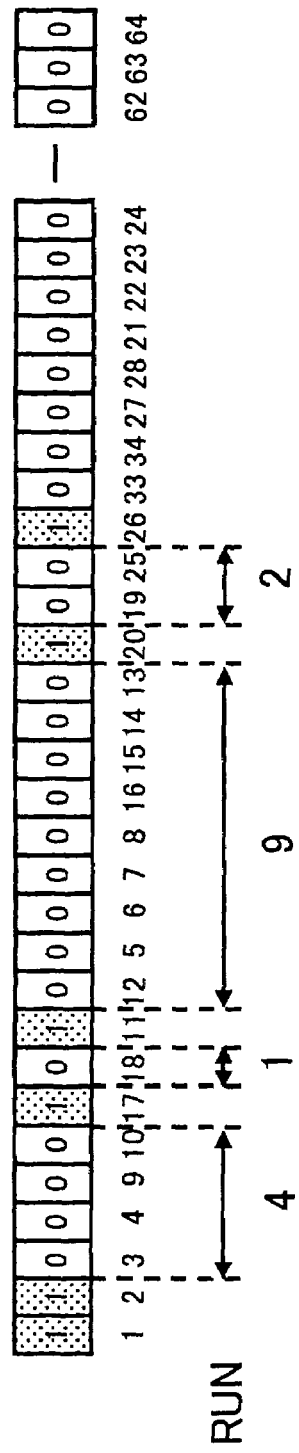
FIG. 21 is an illustration of an information register according to the horizontal-prioritized scan according to the third preferred embodiment.
Figure 22:
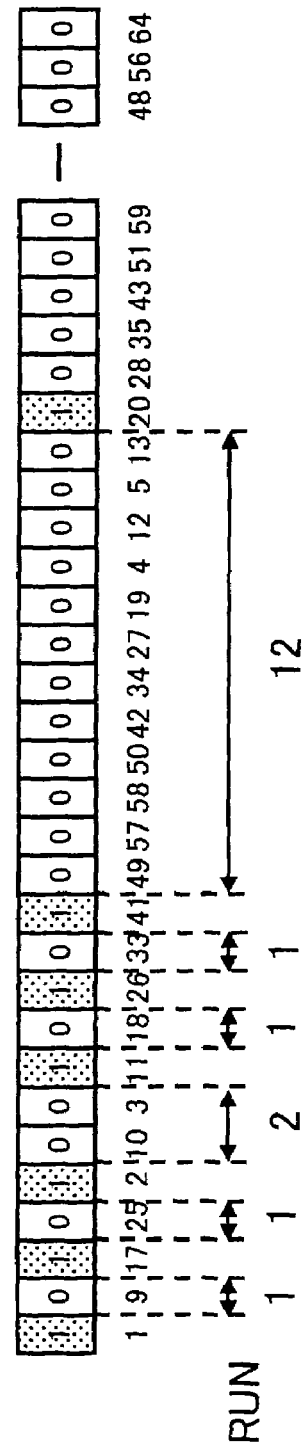
FIG. 22 is an illustration of the information register according to the vertical-prioritized scan according to the third preferred embodiment.

After the completion of the variable length decoding corresponding to one macro block (Steps S46 and S47), the DC coefficients of the respective blocks are transferred to the second data buffer 15 (Step S48), and the prediction direction which determines the data arrangement is judged by means of the foregoing method in the post-stage processing unit 10 (Step S49). In the case in which the AC prediction is being executed, the data is decoded in the horizontal scanning order or the vertical scanning order. As a result, the data arrangement in the information register in the case of the horizontal scan is as shown in FIG. 21, while the data arrangement in the information register in the case of the vertical scan is as shown in FIG. 22.

The first read control unit 8 judges the information register 6 (Step S50), and the address corresponding to the bit in which "1" is stored in the information register 6 is outputted to the data buffer 4 so that the "LEVEL" stored at the address is read (Step S51). In the selecting unit 9, as soon as the judgment of the information register 6 is made by the first read control unit 8, "0" is outputted to the second data buffer 15 when the bit of the information register 6 is "0", while the "LEVEL" as the output data from the first data buffer 4 is outputted when the bit is "1" (Step S51).

The second write control unit 16 writes the data from the selecting unit 9 in conjunction with the first read control unit 8 (Step S52).

After the write of the data corresponding to one block with respect to the second data buffer 15 is completed (YES in Step S53), the second read control unit 17 reads the data according to the scanning method suitable for the determined prediction direction from the second data buffer 15 (Steps S54 and S55), and outputs the read data to the post-stage processing unit 10 (Step S56). At the same time, the variable length decoding unit 3 starts to decode the next block (Step S41).

In the variable length decoding unit 3, the data is decoded in the state in which the "RUN" and the "LEVEL" corresponding to one block are combined. If the post-stage processing unit 10 has completed the processing (YES in Step S57), the foregoing operation is repeated (Step S58). If the post-stage processing unit 10 has not completed the processing, the data transfer is suspended.

The block in which the CBP is "0" may not be transferred to the second data buffer 15. Because the CBP information as well as the DC coefficient are outputted to the post-stage processing unit 10, the post-stage processing unit 10 handles all of the relevant blocks in the second data buffer 15 as "0" and executes the post-stage processing.

According to the present embodiment constituted as described, the following effects are exerted.

Because the step of transferring only the DC coefficient is added, the variable length coding process through the AC prediction used in the MPEG-4 or the like can be accelerated.

Fourth Preferred Embodiment

A variable length decoding device according to a fourth preferred embodiment of the present invention is described referring to the drawings.

Figure 23:
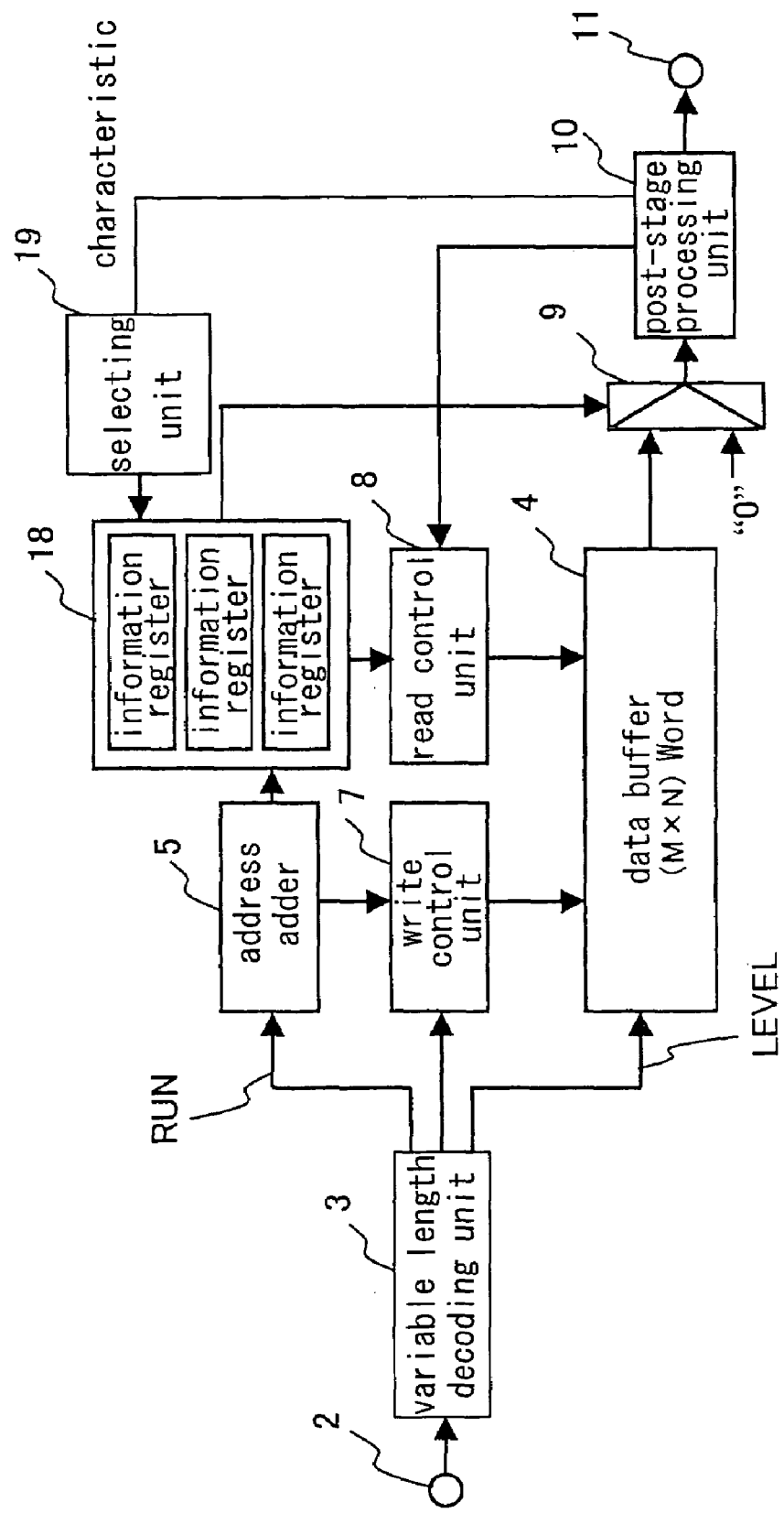
FIG. 23 is a block diagram illustrating a constitution of a variable length decoding device according to a fourth preferred embodiment of the present invention.

FIG. 23 shows a schematic constitution of the variable length decoding device according to the fourth preferred embodiment. Any component shown in FIG. 23, which is constituted in a similar manner as in the first preferred embodiment, is indicated by the same numeral and not described here again.

The variable length decoding device according to the present embodiment is constituted in such manner that a group of information registers 18 including at least one information register capable of storing the data of m×n bits in different arrangement orders based on the result of the address adder 5 and a register selecting unit 19 for obtaining characteristic information indicating a characteristic of the decoded block from the post-stage processing unit 10 and selecting any of the group of information registers 18 based on the characteristic information are further provided in the constitution of the variable length decoding device according to the first preferred embodiment.

An operation of the variable length decoding device according to the present embodiment is described referring to the drawings. In the description given below, one macro block comprises six blocks of data, each block comprising 8×8 data as an example.

Operations of the input unit 2, variable length decoding unit 3, data buffer 4, address adder 5, write control unit 7, read control unit 8 and selecting unit 9 are the same as the operations thereof described in the first preferred embodiment.

The present embodiment is described referring to the flow chart of FIG. 20.

In the variable length decoding unit 3, the data is decoded in the state in which the "RUN" and the "LEVEL" corresponding to one macro block are combined (Steps S41 and S42). When the write of the "LEVEL" is completed (Steps S43 and S45), the read control unit 8 reads the DC coefficients of the respective bocks from the data buffer 4 (Step S48), and outputs the read DC coefficients to a post-stage processing unit 10. As shown in FIG. 17, the prediction direction is determined from the received DC coefficients received by the post-stage processing unit 10 and a selection signal indicating the scanning order is outputted to the register selecting unit 19. The register selecting unit 19 selects the suitable information register from the group of information register 18 so that the read control unit 8 and the selecting unit 9 are controlled. Operations of the selecting unit 9, post-stage processing unit 10 and output unit 11 thereafter are the same as described in the first preferred embodiment.

According to the present embodiment constituted as described, the following effects are exerted.

The information registers having the plurality of arrangement orders are provided in the group of information register 18, and the information register can be selected based on the information inputted from the post-stage processing unit 10 so that the decoding speed in the variable length decoding in the MPEG-4, for example, can be improved.

Fifth Preferred Embodiment

A variable length decoding device according to a fifth preferred embodiment of the present invention is described referring to the drawings.

Figure 24:
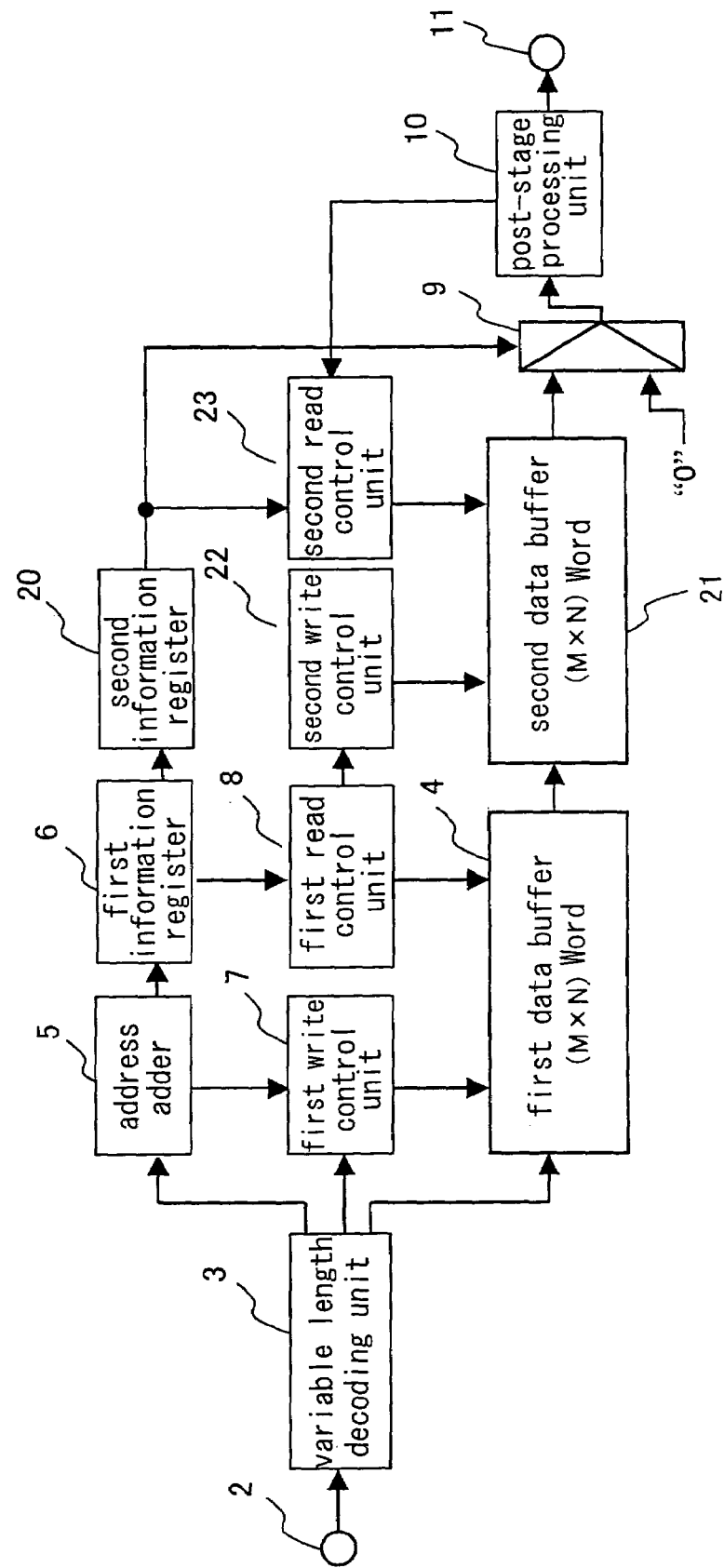
FIG. 24 is a block diagram illustrating a constitution of a variable length decoding device according to a fifth preferred embodiment of the present invention.

FIG. 24 shows a schematic constitution of the variable length decoding device according to the fifth preferred embodiment. Any component shown in FIG. 24, which is constituted in a similar manner as in the first preferred embodiment, is indicated by the same numeral and not described here again.

The variable length decoding device according to the present embodiment is constituted in such manner that a second information register 20 for memorizing the result of the address adder 5, a second data buffer 21 for storing the "LEVEL" from the first data buffer 4, a second write control unit 22 for controlling the write of the data with respect to the second data buffer 21, and a second read control unit 23 for reading the "LEVEL" from the second data buffer 21 based on the second information register 20 are further provided in the constitution of the variable length decoding device according to the first preferred embodiment.

An operation of the variable length decoding device according to the present embodiment is described referring to the drawings. The present embodiment is described referring to the case in which one block includes 8×8 number of data.

Operations of the input unit 2, variable length decoding unit 3, first data buffer 4, address adder 5, first write control unit 7, and first read control unit 8 are the same as the operations thereof described in the first preferred embodiment.

Figure 25:
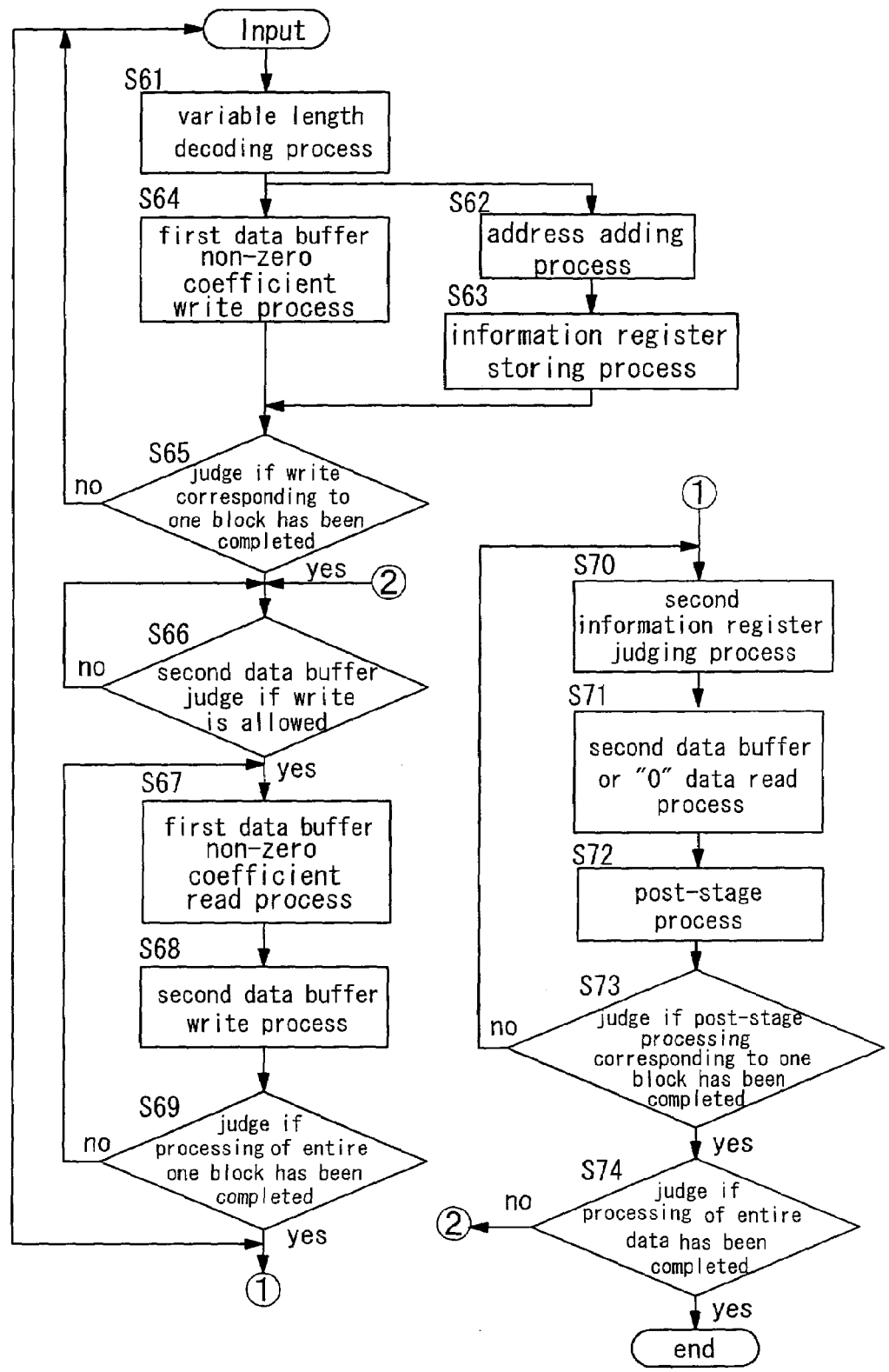
FIG. 25 is a flow chart of an operation of the variable length decoding device according to the fifth preferred embodiment.

FIG. 25 is a flow chart of an operation of the variable length decoding device according to the fifth preferred embodiment. Referring to FIG. 25, the processing flow is described.

In the variable length decoding unit 3, the data is decoded in the state in which the "RUN" and the "LEVEL" corresponding to one block are combined (Step S61). When the write of the "LEVEL" is completed (Steps S62 through S64), the first read control unit 8 judges the first information register (Step S66), and outputs the address corresponding to the bit in which "1" is stored in the first information register 6 to the first data buffer 4 to thereby read the "LEVEL" stored at the address (Step S67). The second write control unit 22 writes the data from the first data buffer 4 in the second data buffer 21 in conjunction with the first read control unit 8 (Step S68).

After the write of the data corresponding to one block with respect to the second data buffer 21 is completed (YES in Step S69), the second read control unit 23 judges the second information register 20 (Step S70), and outputs the address corresponding to the bit in which "1" is stored in the second information register 20 to the second data buffer 21 to thereby read the "LEVEL" stored at the address (Step S71).

The selecting unit 9, as soon as the second read control unit 23 judges the second information register 20, outputs "0" to the post-stage processing unit 10 when the bit of the second information register 20 is "0", while outputting the "LEVEL" as the output data from the second data buffer 21 when the bit is "1" (Step S72). At the same time, the variable length decoding unit 3 starts to decode the next block (Step S61), and the data is decoded in the state in which the "RUN" and the "LEVEL" corresponding to one block are combined (Step S61). Then, the foregoing operation is repeated (Step S74) if the post-stage processing unit 10 has completed the processing (YES in Step S37), while the data transfer is suspended if not completed.

According to the present embodiment constituted as described, the following effects are exerted.

The data of the first data buffer 4 can be outputted without waiting for the processing of the post-stage processing unit 10 to be completed. Further, only the "LEVEL" is transferred between the data buffers. As a result, the next variable length decoding can be soon executed, which further accelerates the decoding process.

Sixth Preferred Embodiment

A variable length decoding device according to a sixth preferred embodiment of the present invention is described referring to the drawings.

Figure 26:
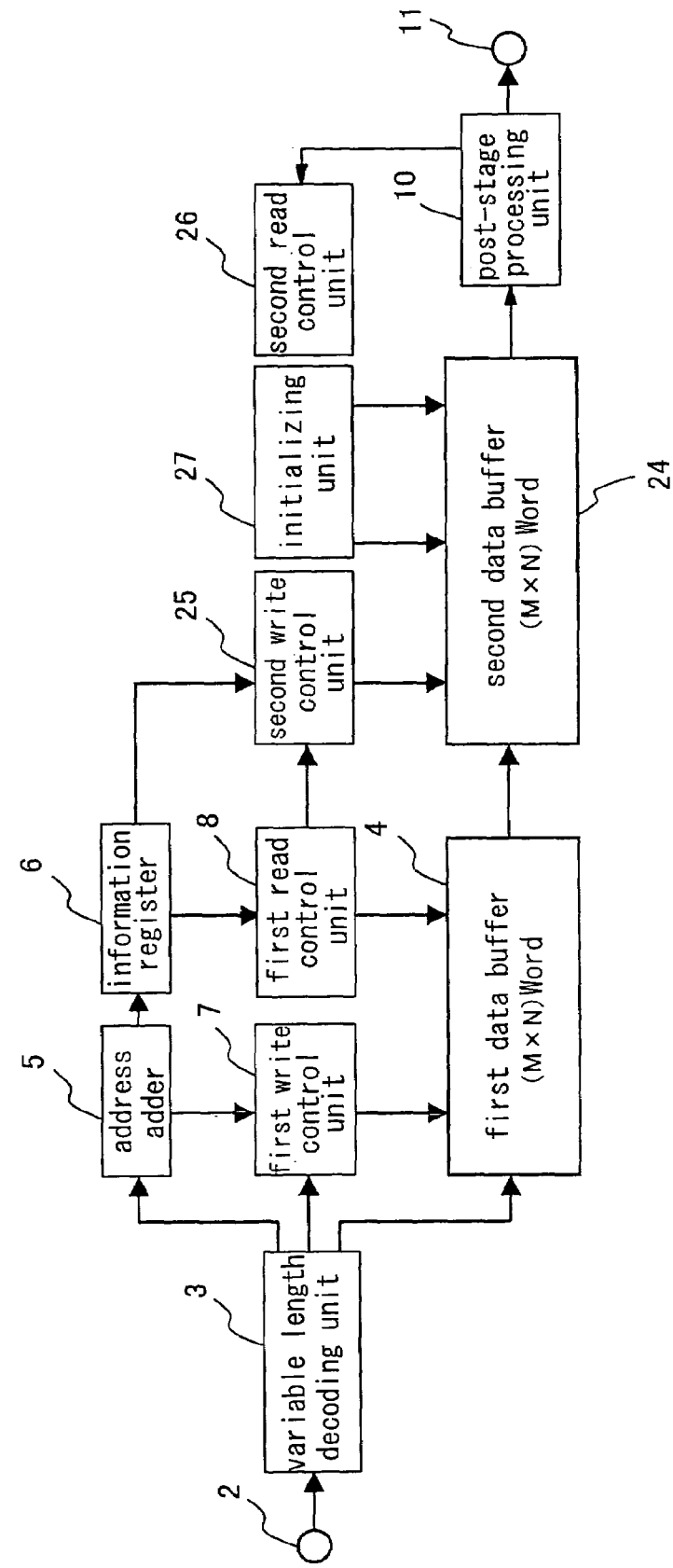
FIG. 26 is a block diagram illustrating a constitution of a variable length decoding device according to a sixth preferred embodiment of the present invention.

FIG. 26 shows a schematic constitution of the variable length decoding device according to the sixth preferred embodiment. Any component shown in FIG. 26, which is constituted in a similar manner as in the first preferred embodiment, is indicated by the same numeral and not described here again.

The variable length decoding device according to the present embodiment is constituted in such manner that a second data buffer 24 for storing the "LEVEL" from the first data buffer 4, a second write control unit 25 for controlling the write of the data with respect to the second data buffer 24, a second read control unit 26 for reading the "LEVEL" from the second data buffer 24, and an initializing unit 27 for initializing the second data buffer 24 are further provided in the constitution of the variable length decoding device according to the first preferred embodiment.

An operation of the variable length decoding device according to the present embodiment is described referring to the drawings. The present embodiment is described referring to the case in which one block includes 8×8 number of data.

Operations of the input unit 2, variable length decoding unit 3, first data buffer 4, address adder 5, first write control unit 7, and first read control unit 8 are the same as the operations thereof described in the first preferred embodiment.

Figure 27:
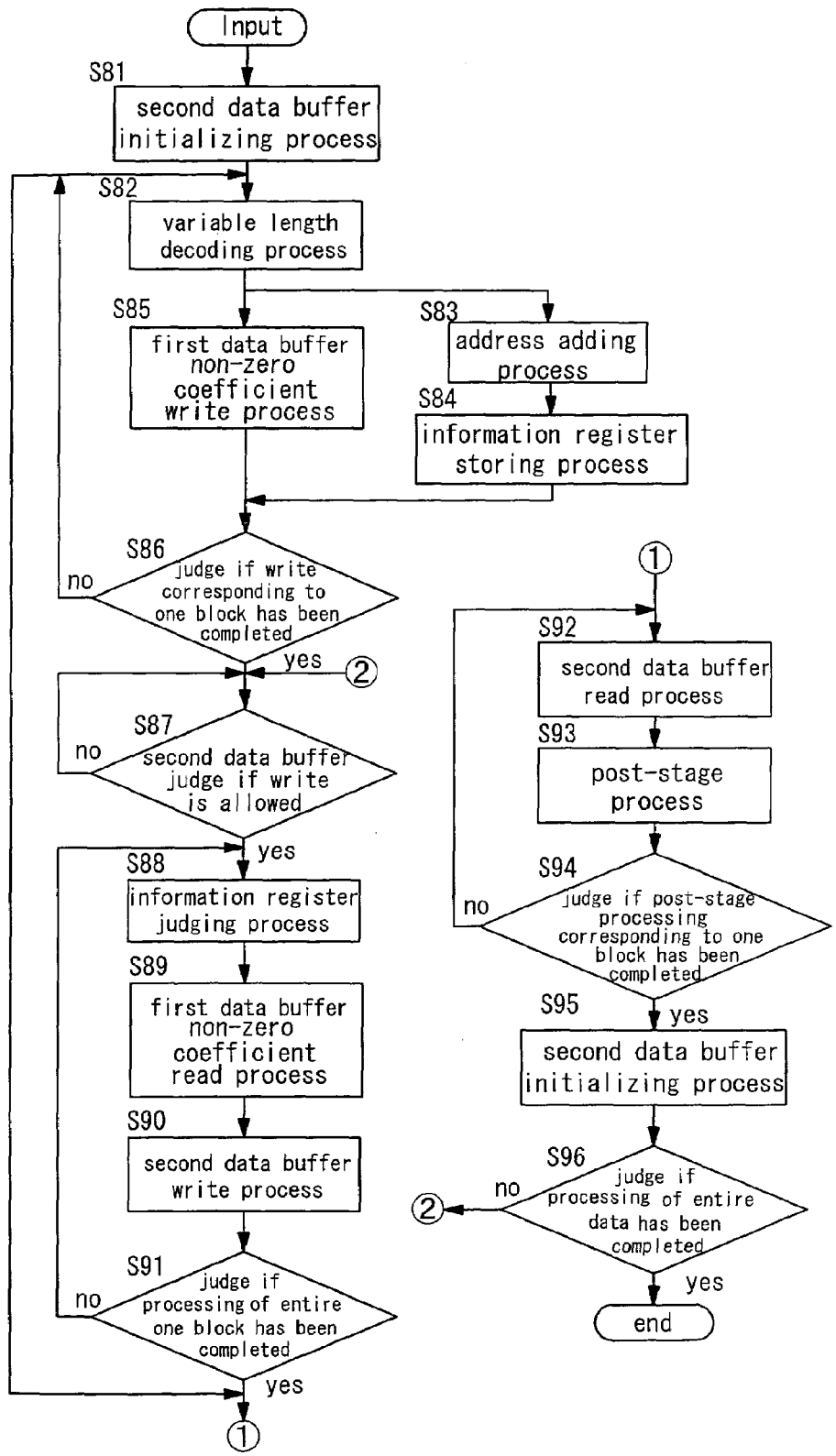
FIG. 27 is a flow chart of an operation of the variable length decoding device according to the sixth preferred embodiment.

FIG. 27 is a flow chart of an operation of the variable length decoding device according to the sixth preferred embodiment. Referring to FIG. 27, the processing flow is described.

Before the decoding process is initiated, the initializing unit 27 initializes all of the values in the second data buffer 24 to "0" (Step S81).

In the variable length decoding unit 3, the data is decoded in the state in which the "RUN" and the "LEVEL" corresponding to one block are combined (Step S82). When the write of the "LEVEL" is completed (Steps S83 through S85), the first read control unit 8 judges the first information register (Steps S87 and S88), and outputs the address corresponding to the bit in which "1" is stored in the first information register 6 to the first data buffer 4 to thereby read the "LEVEL" stored at the address (Step S89). The second write control unit 25 writes the data from the first data buffer 4 at the address read by the first read control unit 8 in the second data buffer 24 so as to overwrite the initialized data therein in conjunction with the first read control unit 8 (Step S90).

After the write of the data corresponding to one block in the second data buffer 24 is completed (YES in Step S91), the second read control unit 26 serially reads the data including the initialized data from the second data buffer 24 (Step S92). At the same time, the variable length decoding unit 3 starts to decode the next block (Step S82), and the data is decoded in the state in which the "RUN" and the "LEVEL" corresponding to one block are combined. Then, the foregoing operation is repeated (Step S96) if the post-stage processing unit 10 has completed the processing (YES in Step S94), while the data transfer is suspended if not completed.

The initializing unit 27 initializes the second data buffer 24 before the read operation with respect to the second data buffer 24 is completed and the write of the next block is commenced (Step S95).

According to the present embodiment constituted as described, the following effects are exerted.

The initializing unit 27 for initializing the second data buffer 24 is provided. Accordingly, the data can be outputted without waiting for the processing of the post-stage processing unit 10 to be completed. Further, only the "LEVEL" is transferred between the data buffers. As a result, the next variable length decoding can be soon executed, which further accelerates the decoding process.

Seventh Preferred Embodiment

A variable length decoding device according to a seventh preferred embodiment of the present invention is described referring to the drawings.

Figure 28:
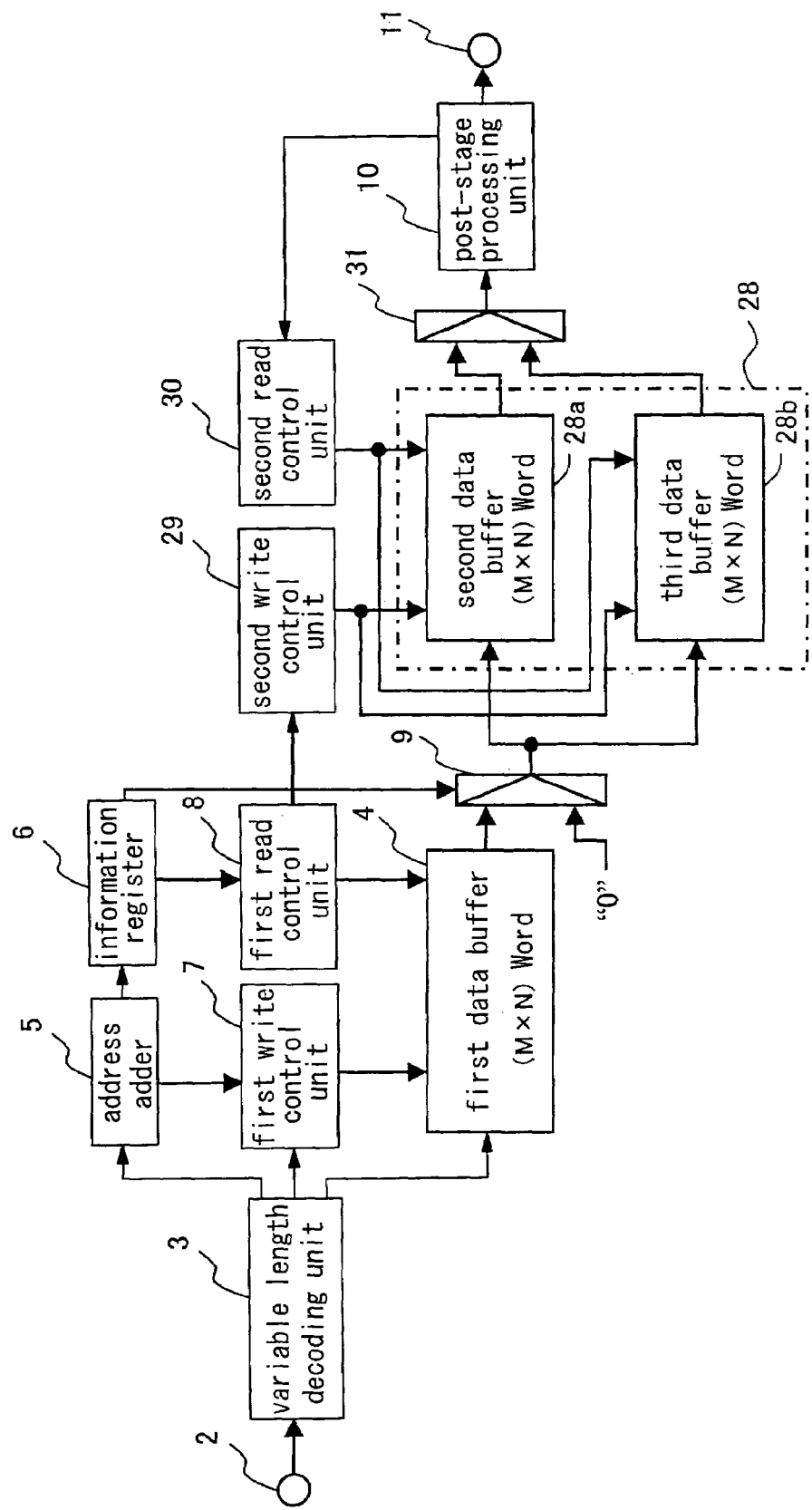
FIG. 28 is a block diagram illustrating a constitution of a variable length decoding device according to a seventh preferred embodiment of the present invention.

FIG. 28 shows a schematic constitution of the variable length decoding device according to the seventh preferred embodiment. Any component shown in FIG. 28, which is constituted in a similar manner as in the first preferred embodiment, is indicated by the same numeral and not described here again.

The variable length decoding device according to the present embodiment is constituted in such manner that a group of data buffers 28 including at least a data buffer, a second write control unit 29, a second read control unit 30, and a second selecting unit 31 for selecting the data to be read from the group of data buffers 28 are further provided in the constitution of the variable length decoding device according to the first preferred embodiment.

An operation of the variable length decoding device according to the present embodiment is described referring to the drawings. The present embodiment is described referring to the case in which one block includes 8×8 number of data. Further, in the description below, the group of data buffers 28 include two data buffers (second and third data buffers 28a and 28b).

Operations of the input unit 2, variable length decoding unit 3, first data buffer 4, address adder 5, information register 6, first write control unit 7, and first read control unit 8 are the same as the operations thereof described in the first preferred embodiment.

In the variable length decoding unit 3, the data is decoded in the state in which the "RUN" and the "LEVEL" corresponding to one block are combined. When the write of the "LEVEL" is completed, the first read control unit 8 judges the first information register, and outputs the address corresponding to the bit in which "1" is stored in the first information register 6 to the first data buffer 4 to thereby read the "LEVEL" stored at the address. The selecting unit 9, as soon as the first read control unit 8 judges the information register 6, outputs "0" to the second data buffer 15 when the bit of the information register 6 is "0", while outputting the "LEVEL" as the output data from the first data buffer 4 when the bit is "1".

The second write control unit 29 writes the data from the selecting unit 9 in the second data buffer 28a in conjunction with the first read control unit 8.

When the write of the data corresponding to one block with respect to the second data buffer 28a is completed, the second read control unit 30 reads the data from the second data buffer 28a and outputs the read data to the second selecting unit 31. The second selecting unit 31 switches to and from the data from the second data buffer 28a and the data from the third data buffer 28b every time when the processing corresponding to one block is completed, and outputs the selected data to the post-stage processing unit 10. As soon as the write of the data corresponding to one block with respect to the second data buffer 28a is completed, the variable length decoding unit 3 starts to decode the next block.

In response to the completion of the data decoding in the state in which the "RUN" and the "LEVEL" corresponding to one block are combined in the variable length decoding unit 3, the data transfer to the third data buffer 28b is commenced. After the decoding process corresponding to one block is completed in the variable length decoding unit 3, the data from the selecting unit 9 is alternately written in the second data buffer 28a and the third data buffer 28b.

According to the present embodiment constituted as described, the following effects are exerted.

The post-stage processing unit 10 comprises the plurality of data buffers to be read. Accordingly, the data can be outputted without waiting for the processing of the post-stage processing unit 10 to be completed. As a result, the next variable length decoding can be soon executed, which further accelerates the decoding process.

In the present embodiment, the data buffers of the group of data buffers 28 may be more than two.

Eighth Preferred Embodiment

A variable length decoding device according to an eighth preferred embodiment of the present invention is described referring to the drawings.

Figure 29:
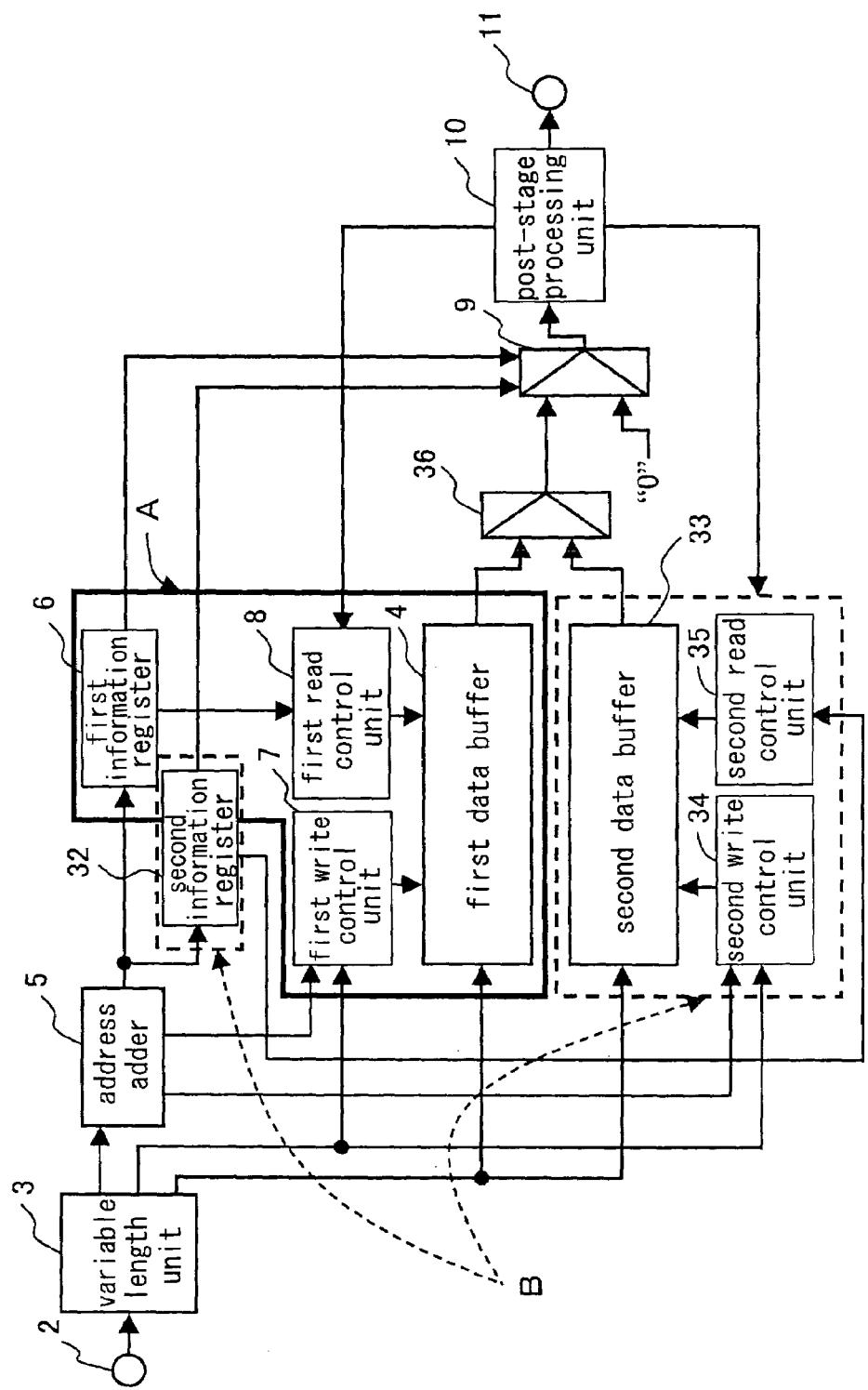
FIG. 29 is a block diagram illustrating a constitution of a variable length decoding device according to an eighth preferred embodiment of the present invention.

FIG. 29 shows a schematic constitution of the variable length decoding device according to the eighth preferred embodiment. Any component shown in FIG. 29, which is constituted in a similar manner as in the first preferred embodiment, is indicated by the same numeral and not described here again.

The variable length decoding device according to the present embodiment is constituted in such manner that a plurality of processing systems for executing the processings from the storage of the result of the address adder (value showing the position of the "LEVEL") in the information register based on the decoded "RUN" through the read of the data from the data buffer is further provided in the constitution of the variable length decoding device according to the first preferred embodiment. Below is given a description referring to an example in which the two processing systems are provided.

The variable length decoding device according to the present embodiment, as shown in FIG. 29, further comprises a second information register 32 for memorizing the result of the address adder 5, a second data buffer 33 for storing the "LEVEL" from the variable length decoding unit 3, a second write control unit 34 for storing the "LEVEL" in the second data buffer 33 based on the information from the address adder 5, a second read control unit 35 for reading the "LEVEL" from the second data buffer 33 based on the second information register 32, and a switching unit 36 for switching to and from the data from the first data buffer 4 and the data from the second data buffer 33 and outputting the selected data.

An operation of the variable length decoding device according to the present embodiment is described referring to the drawings. The present embodiment is described referring to the case in which one block includes 8×8 number of data.

As shown in FIG. 29, the processings executed by the first information register 6, first data buffer 4, first write control unit 7 and first read control unit 8 in the same manner as in the first preferred embodiment are referred to as a processing A, and the processings executed by the second information register 32, second data buffer 33, second write control unit 34 and second read control unit 35 in the same manner as in the first preferred embodiment are referred to as a processing B.

Based on the magnitude of the "RUN" decoded in the variable length decoding unit 3, the address calculation is executed in the order of the zigzag scan shown in FIG. 38, that is, in the order of 1→2→9→17 . . . in the address adder 5. When the write operation according to the processing A is executed, and the output of the decoding data corresponding to one block from the variable length decoding unit 3 is completed, the read operation according to the processing A, and the decoding data is outputted from the switching unit 36. The decoding data corresponding to the next one block is serially inputted from the variable length decoding unit 3 at the same time as the read operation according to the processing A, and then, the address is calculated by the address adder 5 so as to execute the write operation according to the processing B.

When the output of the decoding data corresponding to one block from the variable length decoding unit 3 is completed, the read operation according to the processing B is executed, and the decoding data is outputted from the switching unit 36. The decoding data corresponding to the next one block is serially inputted from the variable length decoding unit 3 at the same time as the read operation according to the processing B so as to execute the write operation according to the processing A.

Thereafter, operations of the post-stage processing unit 10 and output unit 11 are the same as the operations thereof described in the first preferred embodiment.

According to the present embodiment constituted as described, the following effects are exerted.

The write and read operations can be simultaneously executed because the constitution of the first preferred embodiment is doubled. Therefore, it becomes unnecessary to wait for the read operation with respect to the data buffer to be completed, which shortens the data transfer time. As a result, the processing time of the general variable length decoding process can be shortened, and the high-rate decoding process can be realized.

Ninth Preferred Embodiment

A variable length decoding device according to a ninth preferred embodiment of the present invention is described referring to the drawings.

Figure 30:
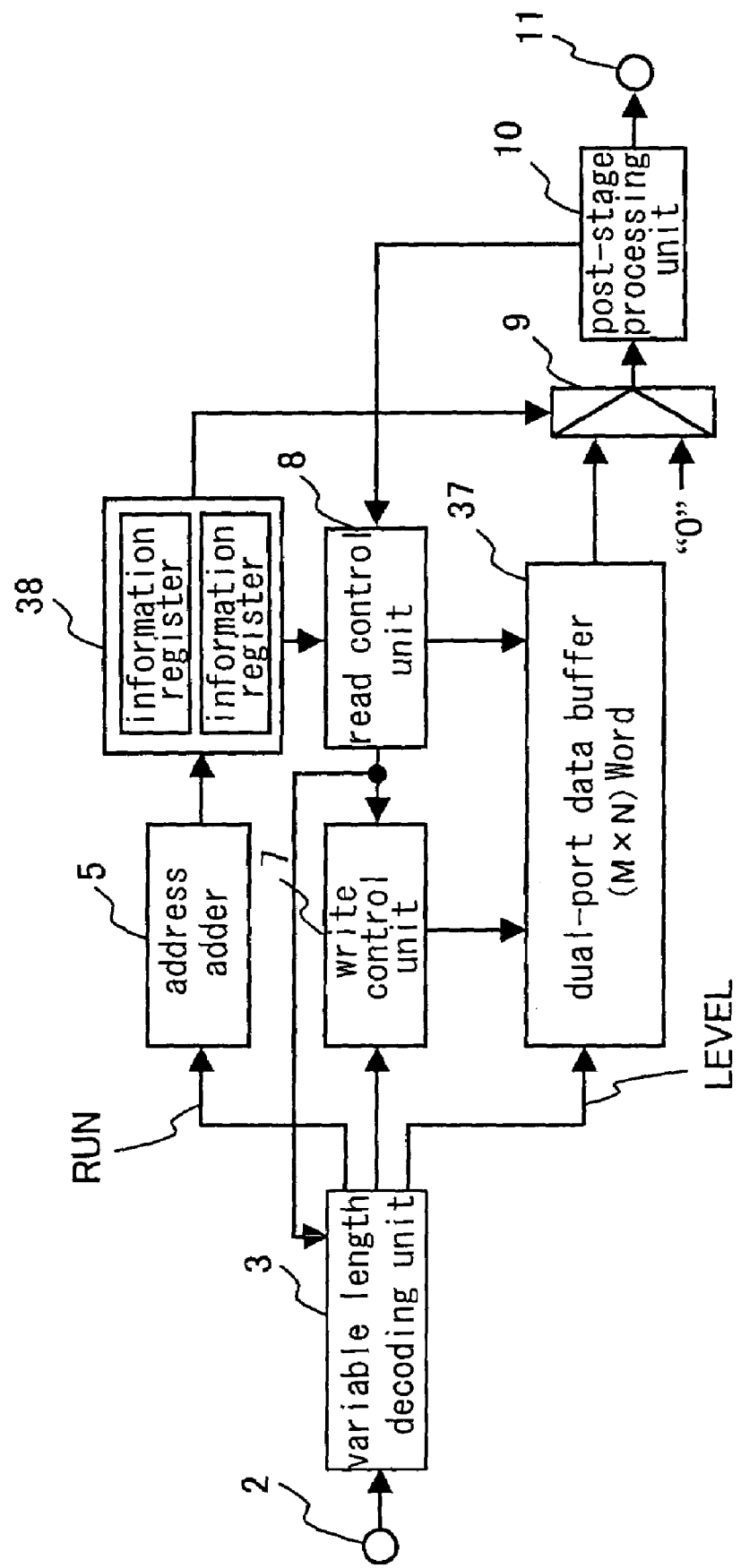
FIG. 30 is a block diagram illustrating a constitution of a variable length decoding device according to a ninth preferred embodiment of the present invention.

FIG. 30 shows a schematic constitution of the variable length decoding device according to the ninth preferred embodiment. Any component shown in FIG. 30, which is constituted in a similar manner as in the first preferred embodiment, is indicated by the same numeral and not described here again.

The variable length decoding device according to the present embodiment is constituted in such manner that a data buffer 37 comprising a write port and a read port capable of independently reading the data and an information register 38 having a bit length corresponding to at least one block are further provided in the constitution of the variable length decoding device according to the first preferred embodiment.

Figure 31:
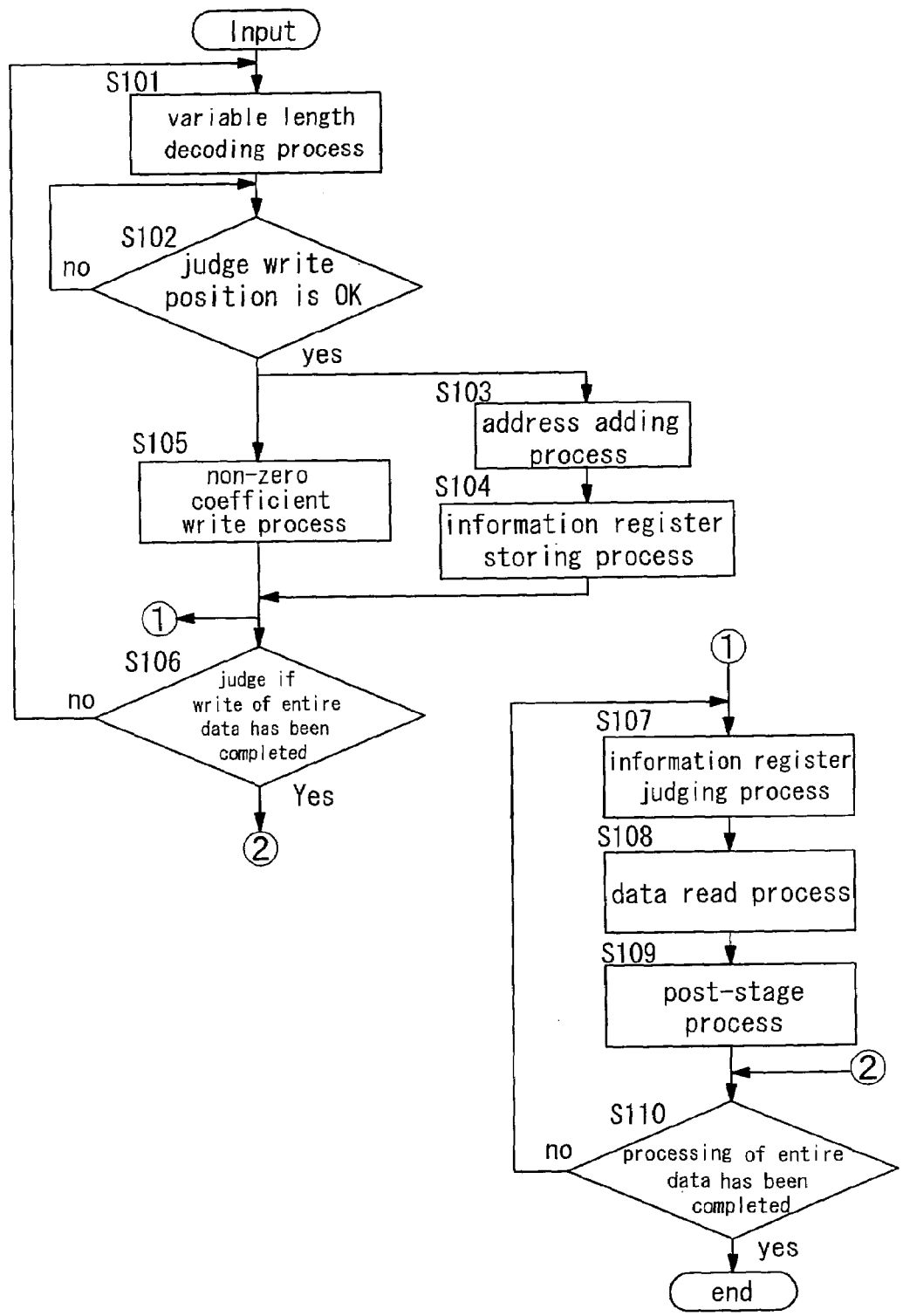
FIG. 31 is a flow chart of an operation of the variable length decoding device according to the ninth preferred embodiment.
Figure 32:
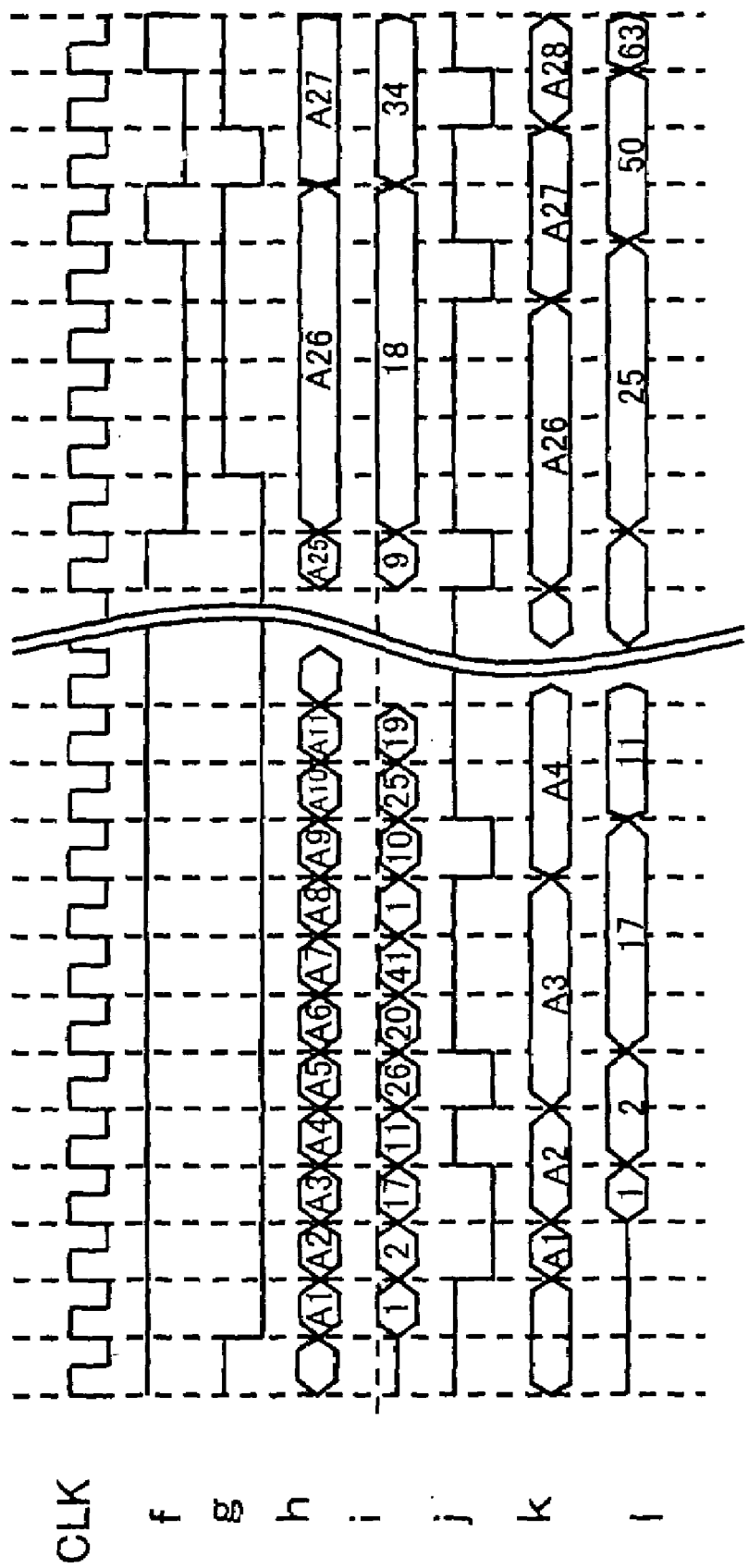
FIG. 32 is a timing chart of the operation of the variable length decoding device according to the ninth preferred embodiment.

FIG. 31 is a flow chart of an operation of the variable length decoding device according to the ninth preferred embodiment. Referring to FIG. 31, the processing flow is described. Further, FIG. 32 shows a timing according to the ninth preferred embodiment. The present embodiment is described referring to the case in which one block includes 8×8 number of data.

Operations of the input unit 2 and the address adder 5 are the same as the operations thereof described in the first preferred embodiment.

In the variable length decoding unit, 3, the data is decoded in the state in which the "RUN" representing the number of "0" and the "LEVEL" representing the magnitude of the coefficient value are combined (Step S101), the "LEVEL" is written in the data buffer 37 having the dual ports (Steps S102 through S105). The "LEVEL" is closely stored in the data buffer 37 in the order of smaller addresses as shown in FIG. 33. When the "LEVEL" is stored in the data buffer 37 from the variable length decoding unit 3, the read process is commenced (Steps S107 and S108), and the address corresponding to the bit in which "1" is stored in the information register 38 is outputted to the data buffer 37 so that the "LEVEL" stored at the address is read(Step S108). The selecting unit 9, as soon as the read control unit 8 judges the information register 38, outputs "0" to the post-stage processing unit 10 when the bit of the information register 38 is "0" (Step S109), while outputting the "LEVEL" as the output data from the data buffer 4 when the bit is "1".

As described, the write and read operations are executed at the same time, and it is judged whether or not the write position of the "LEVEL" to be decoded in the data buffer is the position at which the write and read of the "LEVEL" is allowed. Then, the variable length decoding process is temporarily halted if not the position at which the write is allowed.

Figure 34:
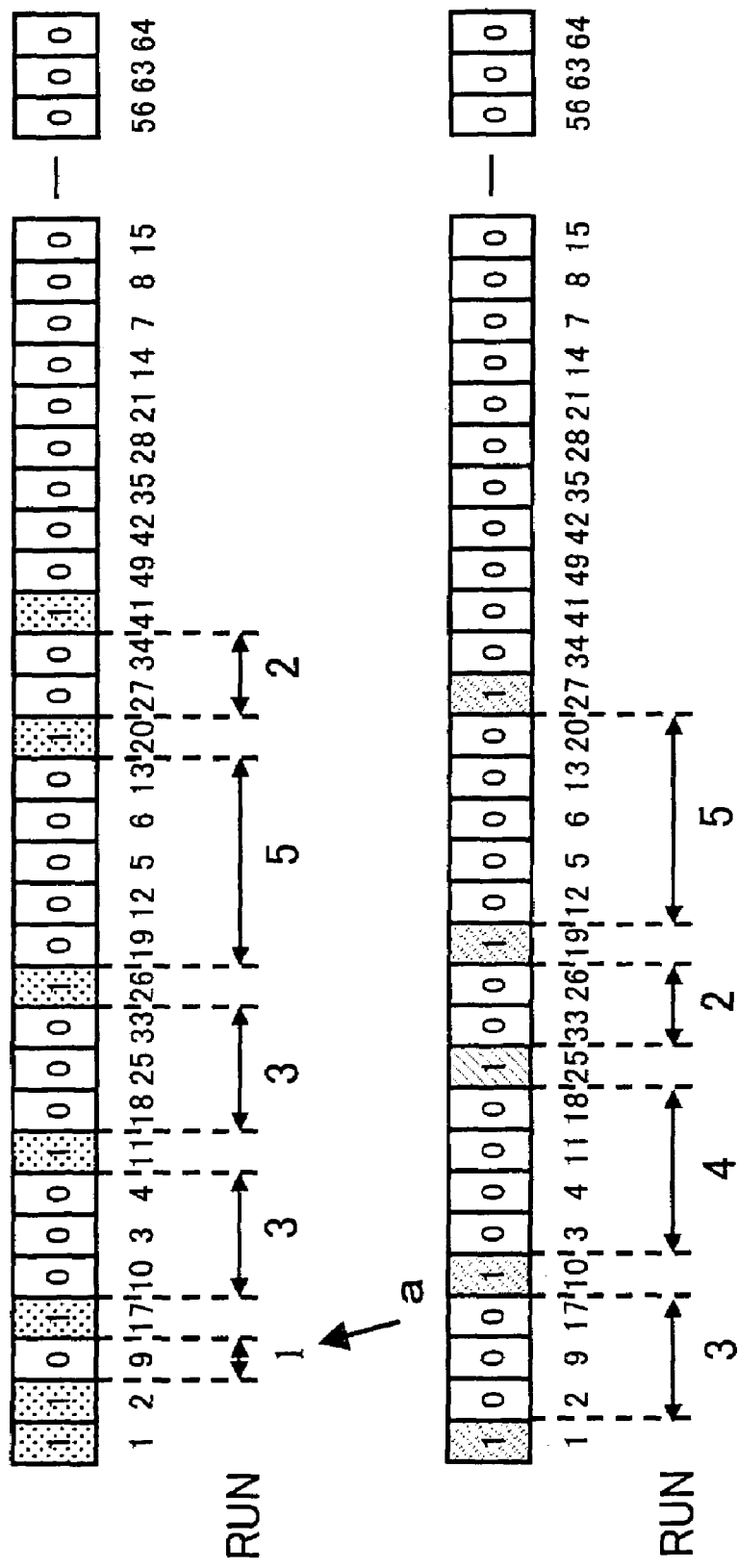
FIG. 34 is an illustration of an information register according to the ninth preferred embodiment.

As shown in FIG. 32, the write operation is effective while a signal f is "H", and data I is stored at a position of an address h by converting a signal G to "L". The write operation is halted while the signal f if "L". The read operation is executed by a signal j, and the signal j serves to read the "LEVEL" at an address k corresponding to a bit in which "1" is stored in the information register 38. When the "LEVEL" at the write position is read and the write operation is allowed, the signal f is converted to "H" so that the variable length decoding is restarted. The variable length decoding is continuously executed to the next blocks as long as the write operation is allowed as shown in FIGS. 33 and 34.

According to the present embodiment constituted as described, the following effects are exerted.

In the case of the post-stage processing unit capable of exerting a sufficient performance, the data transfer can be executed without waiting for the read process with respect to the data buffer because the write and read of the data are executed at the same time. Thereby, the processing time of the variable length decoding can be shortened.

The data is closely stored in the data buffer, which enables the data buffer to be efficiently used and to have a reduced capacity.

From the foregoing description, the decoding process can attain a higher rate in the generally optimum constitution.

Tenth Preferred Embodiment

Figure 35:
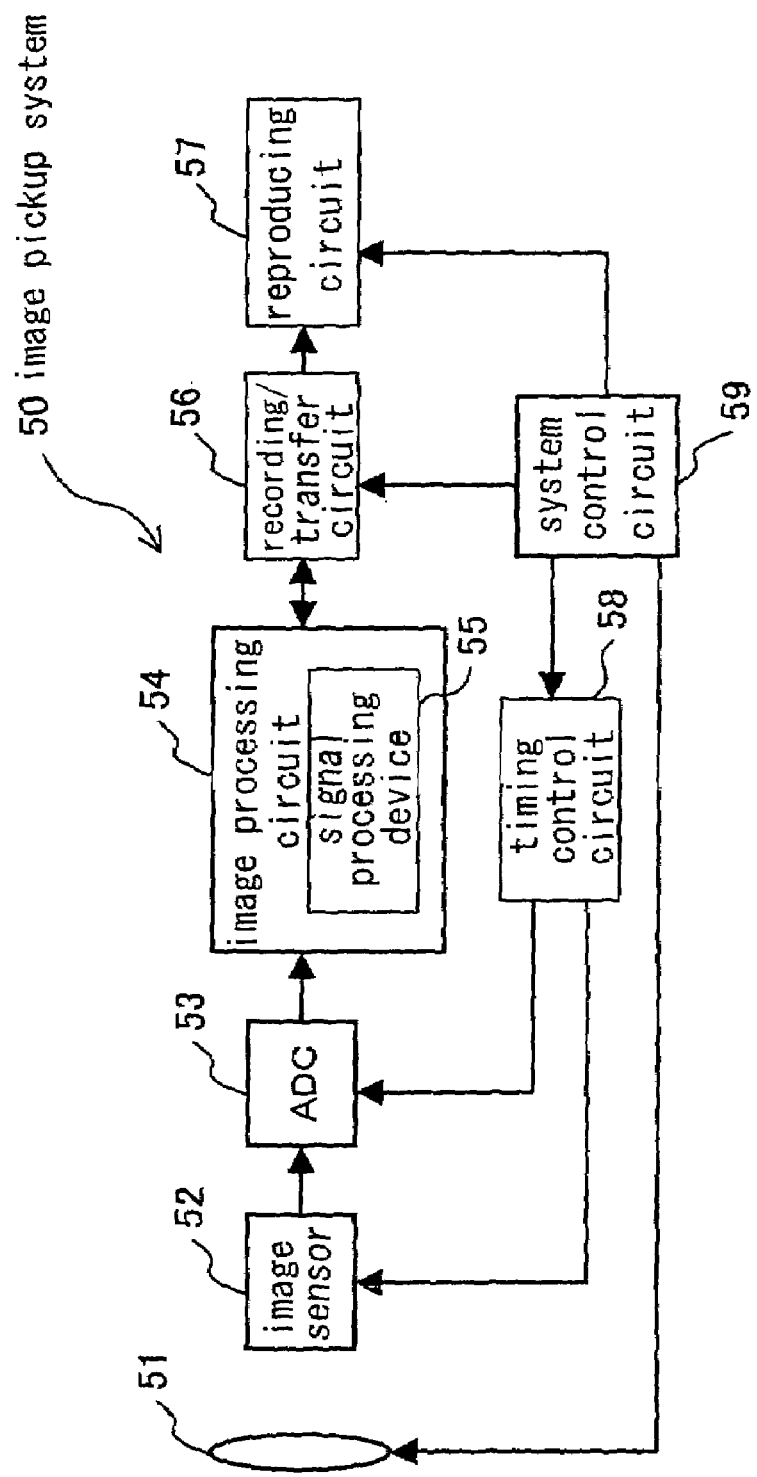
FIG. 35 is a block diagram illustrating a constitution of an image pickup system according to a tenth preferred embodiment of the present invention.
Figure 36:
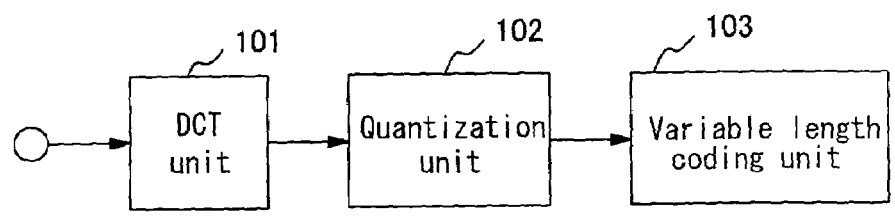
FIG. 36 is a block diagram illustrating a constitution of a typical image coding device.
Figure 37:
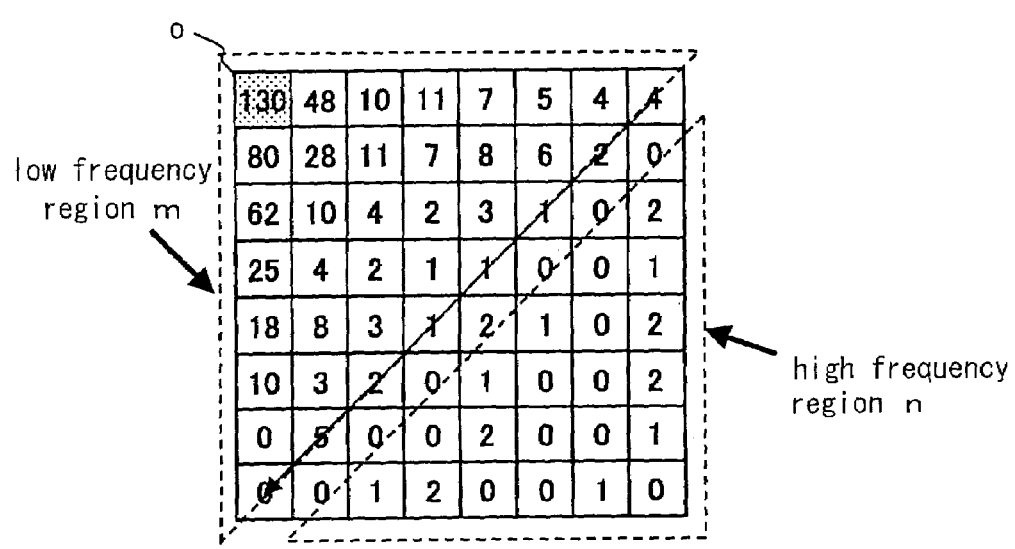
FIG. 37 is an illustration of an example of a DC coefficient.

FIG. 35 is a block diagram illustrating a constitution of an image pickup system 50, an example of which is a digital still camera (DSC), according to a tenth preferred embodiment of the present invention. A signal processing device 55 shown in FIG. 35 is any of the variable length decoding devices according to the first through ninth preferred embodiments of the present invention described earlier.

As shown in FIG. 35, an image light entering an optical system 51 is image-formed on an image sensor 52. The image sensor 52 is driven by a timing control circuit 58 to thereby store the image-formed light and photo-electrically convert the stored light into an electrical signal. The electrical signal read from the image sensor 52 is converted into a digital signal in an analog/digital converter (ADC) 53, and then inputted to an image processing circuit 54 including the signal processing device 55. In the image processing circuit 54, image processes, such as a Y/C process, an edging process, an image enlargement/reduction process, an image compression/extension process according to the present invention, are executed. The image-processed signal is recorded on a medium or transferred by a recording/transfer circuit 56. The recorded or transferred signal is reproduced in a reproducing circuit 57. A system control circuit 59 controls the entire image pickup system 50.

The image processes in the signal processing device 55 according to the preferred embodiments of the present invention are not necessarily applied to only the signal based on the light image-formed on the image sensor 52 via the optical system 51. For example, the image processes may be applied in the case of processing an image signal inputted from an external device as an electrical signal.

As thus far described, in the variable length decoding device and the variable length decoding method according to the present invention, the information corresponding to the data stored in the data buffer is grasped by the address retainer (combination of address adder and information register or address memorizing unit) so that the data of other than "0" is read. Accordingly, the time length required for the read operation is shortened, the variable length decoding attains a higher speed, and the power consumption is reduced. Therefore, the variable length decoding device and the variable length decoding method according to the present invention can be applied to an image decoding system and the like in which a high-rate decoding process is demanded.

The variable length decoding device and the variable length decoding method according to the present invention are effectively applied to a camera-incorporated mobile phone, DSC (digital still camera) and the like in which MPEG-4 is installed, which attracting an attention as a low bit rate coding technology.

While the invention has been described and illustrated in detail, it is to be clearly understood that this is intended be way of illustration and example only and is not to be taken by way of limitation, the spirit and scope of this invention being limited only be the terms of the following claims.

What is claimed is:

1. A variable length decoding device for decoding variable length coding data and run length coding data, comprising:

a variable length decoding unit for serially decoding the variable length coding data and the run length coding data inputted from outside in a state in which "RUN" representing number of "0" and "LEVEL" representing a magnitude of a coefficient value are combined;

a data buffer for storing the "LEVEL";

an address retainer for retaining an address of the "LEVEL" corresponding to the "RUN" based on the number of "0" indicated by the "RUN";

a write control unit for writing the "LEVEL" in the data buffer based on the information of the address retainer;

a read control unit for reading the "LEVEL" from the data buffer based on the information of the address retainer;

a selecting unit for selecting one of the "LEVEL" stored in the data buffer and "0" based on the information of the address retainer and outputting the selected data; and a post-stage processing unit for executing a post-stage processing to the data from the selecting unit and outputting the resulting data outside.

2. A variable length decoding device as claimed in claim 1, wherein the address retainer comprises:

an address adder for calculating the address of the "LEVEL" corresponding to the "RUN" based on the number of "0" indicated by the "RUN" and controlling the write control unit; and an information register for memorizing the result obtained by the address adder and controlling the selecting unit and the read control unit.

3. A variable length decoding device as claimed in claim 2, wherein the address retainer further comprises a clock control unit for controlling a clock to be supplied to the data buffer, and the clock control unit supplies the clock to the data buffer during only a period when a data value is not "0" based on information on whether or not the data value stored in the information register is "0".

4. A variable length decoding device as claimed in claim 1, wherein an address memorizing unit for memorizing the address of the "LEVEL" corresponding to the "RUN" based on the number of "0" indicated by the "RUN" and controlling the write control unit, the read control unit and the selecting unit constitutes the address retainer.

5. A variable length decoding device as claimed in claim 2, wherein the data buffer is adapted to store L (L is a natural number at least two) number of "LEVEL" at one address, a second selecting unit for selecting and outputting the L number of data based on the value of the information register is further provided, and the L number of data is simultaneously read based on the value of the information register.

6. A variable length decoding device as claimed in claim 1, further comprising:
   a second data buffer for storing the data from the selecting unit;
   a second write control unit for controlling a write operation with respect to the second data buffer in conjunction with the operation of the read control unit;
   a second read control unit for controlling a read operation with respect to the second data buffer; and
   the post-stage processing unit for executing the post-stage processing to the data from the second data buffer and outputting the resulting data outside.

7. A variable length decoding device as claimed in claim 6, wherein
   the data from the selecting unit is also outputted to the post-stage processing unit.

8. A variable length decoding device as claimed in claim 2, further comprising:
   a group of information registers including at least an information register for storing the data in different arranging orders based on the result obtained by the address adder; and
   a register selecting unit for obtaining characteristic information indicating a characteristic of the decoding data from the post-stage processing unit and selecting any of the group of information registers based on the characteristic information.

9. A variable length decoding device for decoding variable length coding data and run length coding data, comprising:
   a variable length decoding unit for serially decoding the variable length coding data and the run length coding data inputted from outside in a state in which "RUN" representing number of "0" and "LEVEL" representing a magnitude of a coefficient value are combined;
   a first data buffer for storing the "LEVEL";
   an address adder for calculating an address the "LEVEL" corresponding to the "RUN" based on the number of "0" indicated by the "RUN";
   a first information register for memorizing the result obtained by the address adder;
   a first write control unit for storing the "LEVEL" in the first data buffer based on the information of the address adder;
   a first read control unit for reading the "LEVEL" from the first data buffer based on the value of the first information register;
   a second information register having a constitution identical to that of the first information register;
   a second data buffer for storing the "LEVEL" from the first data buffer;
   a second write control unit for controlling a write operation with respect to the second data buffer in conjunction with the operation of the first read control unit;
   a second read control unit for controlling a read operation with respect to the second data buffer based on a value of the second information register;
   a selecting unit for selecting one of the "LEVEL" stored in the second data buffer and "0" based on the value of the second information register; and
   a post-stage processing unit for executing a post-stage processing to the data outputted from the selecting unit and outputting the resulting data outside.

10. A variable length decoding device as claimed in claim 9, further comprising an initializing unit for initializing the second data buffer, wherein
    the second data buffer is initialized by the initializing unit after the read operation with respect to the second data buffer is completed.

11. A variable length decoding device as claimed in claim 6, further comprising:
    a group of data buffers in which at least one data buffer including the second data buffer is arranged; and
    a second selecting unit for selecting data read from the plurality of data buffers, wherein
    the data from the first data buffer is stored sequentially in each of the plurality of data buffers.

12. A variable length decoding device as claimed in claim 1, further comprising:
    a plurality of processing systems in which the information register, the data buffer, the write control unit and the read control unit constitute a system; and
    a switching unit for controlling in a switching manner which data buffer belonging to one of the processing systems outputs the data to the post-stage processing unit, wherein
    a write operation with respect to the data buffer in one of the processing systems and a read operation with respect to the data buffer in another of the processing systems are simultaneously executed.

13. A variable length decoding device as claimed in claim 2, wherein
    a memory comprising a write port and a read port capable of independently reading the data constitutes the data buffer, the information register has a bit length corresponding to at least one block, and write and read operations are executed in parallel in such manner that the read operation by the read control unit is commenced when the "LEVEL" is written in the data buffer.

14. A variable length decoding device as claimed in claim 1, wherein the post-stage processing unit is a reverse quantization processing unit.

15. A variable length decoding method for decoding variable length coding data and run length coding data, comprising:
    a step of serially inputting the variable length coding data and the run length coding data;
    a step of serially decoding the inputted variable length coding data and the run length coding data in a state in which "RUN" representing number of "0" and "LEVEL" representing a magnitude of a coefficient value are combined;
    a step of retaining an address of the "LEVEL" corresponding to the "RUN" based on the number of "0" indicated by the "RUN";
    a step of storing the "LEVEL" in a data buffer based on the address;
    a step of reading the "LEVEL" from the data buffer based on the address;
    a step of selecting one of the "LEVEL" stored in the data buffer and "0" based on the address and outputting the selected data;
    a step of executing a post-stage processing to the selected data; and
    a step of outputting the post-stage-processed data.

16. A variable length decoding method as claimed in claim 15, wherein
    the step of retaining the address includes:
    a step of calculating the address of the "LEVEL" corresponding to the "RUN" based on the number of "0" indicated by the "RUN"; and a step of memorizing a flag based on the address in an information register.

17. A variable length decoding method as claimed in claim 15, wherein the address of the "LEVEL" corresponding to the "RUN" is directly memorized based on the number of "0" indicated by the "RUN" in the step of retaining the address.

18. A variable length decoding method as claimed in claim 15, further comprising:

a step of storing data from the selecting unit in a second data buffer;

a step of reading the data from the second data buffer;

a step of executing the post-stage processing to the data from the second data buffer; and a step of outputting the post-stage-processed data, wherein the selected data is stored in the second data buffer if the second data buffer is in a writable state.

19. A variable length decoding method as claimed in claim 18, wherein the decoded "LEVEL" is serially closely stored in the first data buffer in the order of smaller addresses, and the stored "LEVEL" or "0" is converted in a predetermined scanning order at the time of the write operation with respect to the second data buffer and outputted.

20. A variable length decoding method as claimed in claim 18, wherein the decoded "LEVEL" is serially closely stored in the first data buffer in the order of smaller addresses, and the stored "LEVEL" or the stored "0" is converted in a predetermined scanning order at the time of the read operation with respect to the second data buffer and outputted.

21. A variable length decoding method as claimed in claim 18, further comprising:

a step of transferring a DC coefficient:

a step of judging a characteristic of the decoding data based on the DC coefficient;

a step of reading the data from the second data buffer in a data arrangement order determined by the judged characteristic of the decoding data;

a step of executing the post-stage processing to the data read from the second data buffer; and a step of outputting the post-stage-processed data.

22. A variable length decoding method as claimed in claim 18, further comprising:

a step of storing a result of a first information register in a second information register;

a step of storing the "LEVEL" read from a first data buffer in the second data buffer;

a step of reading the "LEVEL" from the second data buffer based on the value of the second information register; and a step of selecting one of the "LEVEL" stored in the second data buffer and "0" based on the value of the second information register, wherein the "LEVEL" outputted from the first data buffer is stored in the second data buffer if the second data buffer is in a writable state.

23. A variable length decoding method as claimed in claim 18, further comprising a step of initializing the second data buffer, wherein the second data buffer is initialized after the read operation with respect to the second data buffer is completed.

24. A variable length decoding method as claimed in claim 15, wherein a memory comprising a write port and a read port capable of independently reading the data constitutes the data buffer, further comprising:

a step of closely storing the "LEVEL" in the data buffer in the order of smaller addresses;

a step of starting the read operation as soon as at least one "LEVEL" is stored in the data buffer;

a step of judging whether or not a position at which the "LEVEL" to be decoded is written in the data buffer corresponds to a position at which the "LEVEL" is allowed to be read and written;

a step of temporarily halting the decoding when the write position does not correspond to the position at which the "LEVEL" is allowed to be written; and a step of restarting the decoding when the write operation is allowed.

25. A variable length decoding method as claimed in claim 15, wherein the step of executing the post-stage processing is an inverse quantization step.

26. An image pickup system comprising:

an image processing circuit including any of the variable length decoding devices as claimed in claims 1 through 14, and executing an image processing;

a sensor for outputting an image signal to the image processing circuit; and an optical system for image-forming a light on the sensor.

27. An image pickup system as claimed in claim 26, further comprising a converter for converting the image signal obtained from the sensor into a digital signal and supplying the digital signal to the image processing circuit.

* * * * *